(12) United States Patent
Sommer et al.

(10) Patent No.: US 8,397,131 B1
(45) Date of Patent: Mar. 12, 2013

(54) EFFICIENT READOUT SCHEMES FOR ANALOG MEMORY CELL DEVICES

(75) Inventors: Naftali Sommer, Rishon Lezion (IL); Uri Perlmutter, Ra'anana (IL); Dotan Sokolov, Ra'anana (IL); Eyal Gurgi, Petach Tikva (IL)

(73) Assignee: Apple Inc., Cupertino, CA (US)

( * ) Notice: Subject to any disclaimer, the term of this patent is extended or adjusted under 35 U.S.C. 154(b) by 555 days.

(21) Appl. No.: 12/649,358

(22) Filed: Dec. 30, 2009

Related U.S. Application Data

(60) Provisional application No. 61/265,763, filed on Dec. 2, 2009, provisional application No. 61/264,673, filed on Nov. 26, 2009, provisional application No. 61/256,200, filed on Oct. 29, 2009, provisional application No. 61/141,830, filed on Dec. 31, 2008.

(51) Int. Cl.
*G06F 11/00* (2006.01)

(52) U.S. Cl. ...................................... 714/763

(58) Field of Classification Search .................. None
See application file for complete search history.

(56) References Cited

U.S. PATENT DOCUMENTS

| | | |
|---|---|---|
| 3,668,631 A | 6/1972 | Griffith et al. |
| 3,668,632 A | 6/1972 | Oldham |
| 4,058,851 A | 11/1977 | Scheuneman |
| 4,112,502 A | 9/1978 | Scheuneman |
| 4,394,763 A | 7/1983 | Nagano et al. |
| 4,413,339 A | 11/1983 | Riggle et al. |
| 4,556,961 A | 12/1985 | Iwahashi et al. |
| 4,558,431 A | 12/1985 | Satoh |
| 4,608,687 A | 8/1986 | Dutton |
| 4,654,847 A | 3/1987 | Dutton |
| 4,661,929 A | 4/1987 | Aoki et al. |
| 4,768,171 A | 8/1988 | Tada |
| 4,811,285 A | 3/1989 | Walker et al. |
| 4,899,342 A | 2/1990 | Potter et al. |
| 4,910,706 A | 3/1990 | Hyatt |
| 4,993,029 A | 2/1991 | Galbraith et al. |
| 5,056,089 A | 10/1991 | Mehrotta et al. |
| 5,077,722 A | 12/1991 | Geist et al. |
| 5,126,808 A | 6/1992 | Montalvo et al. |
| 5,163,021 A | 11/1992 | Mehrotra et al. |
| 5,172,338 A | 12/1992 | Mehrotta et al. |
| 5,182,558 A | 1/1993 | Mayo |
| 5,182,752 A | 1/1993 | DeRoo et al. |
| 5,191,584 A | 3/1993 | Anderson |
| 5,200,959 A | 4/1993 | Gross et al. |

(Continued)

FOREIGN PATENT DOCUMENTS

| | | |
|---|---|---|
| EP | 0783754 B1 | 7/1997 |
| EP | 1434236 B1 | 6/2004 |

(Continued)

OTHER PUBLICATIONS

U.S. Appl. No. 12/323,544 Office Action dated Dec. 13, 2011.

(Continued)

*Primary Examiner* — Michael Maskulinski

(74) *Attorney, Agent, or Firm* — Meyertons Hood Kivlin Kowert & Goetzel PC

(57) ABSTRACT

A method for data readout includes sending to a memory device, which includes a plurality of analog memory cells, a request to read a requested memory page that is stored in a first group of the memory cells. A programming status of a second group of the memory cells is reported to the memory device, so as to cause the memory device to select a reading configuration responsively to the reported programming status and to read the requested memory page from the first group of the memory cells using the selected reading configuration. The requested memory page is received from the memory device.

32 Claims, 3 Drawing Sheets

U.S. PATENT DOCUMENTS

| | | |
|---|---|---|
| 5,237,535 A | 8/1993 | Mielke et al. |
| 5,272,669 A | 12/1993 | Samachisa et al. |
| 5,276,649 A | 1/1994 | Hoshita et al. |
| 5,287,469 A | 2/1994 | Tsuboi |
| 5,365,484 A | 11/1994 | Cleveland et al. |
| 5,388,064 A | 2/1995 | Khan |
| 5,416,646 A | 5/1995 | Wells et al. |
| 5,416,782 A | 5/1995 | Wells et al. |
| 5,446,854 A | 8/1995 | Khalidi et al. |
| 5,450,424 A | 9/1995 | Okugaki et al. |
| 5,469,444 A | 11/1995 | Endoh et al. |
| 5,473,753 A | 12/1995 | Wells et al. |
| 5,479,170 A | 12/1995 | Cauwenberghs et al. |
| 5,508,958 A | 4/1996 | Fazio et al. |
| 5,519,831 A | 5/1996 | Holzhammer |
| 5,532,962 A | 7/1996 | Auclair et al. |
| 5,533,190 A | 7/1996 | Binford et al. |
| 5,541,886 A | 7/1996 | Hasbun |
| 5,600,677 A | 2/1997 | Citta et al. |
| 5,638,320 A | 6/1997 | Wong et al. |
| 5,657,332 A | 8/1997 | Auclair et al. |
| 5,675,540 A | 10/1997 | Roohparvar |
| 5,682,352 A | 10/1997 | Wong et al. |
| 5,687,114 A | 11/1997 | Khan |
| 5,696,717 A | 12/1997 | Koh |
| 5,726,649 A | 3/1998 | Tamaru et al. |
| 5,726,934 A | 3/1998 | Tran et al. |
| 5,742,752 A | 4/1998 | De Koening |
| 5,748,533 A | 5/1998 | Dunlap et al. |
| 5,748,534 A | 5/1998 | Dunlap et al. |
| 5,751,637 A | 5/1998 | Chen et al. |
| 5,761,402 A | 6/1998 | Kaneda et al. |
| 5,798,966 A | 8/1998 | Keeney |
| 5,799,200 A | 8/1998 | Brant et al. |
| 5,801,985 A | 9/1998 | Roohparvar et al. |
| 5,838,832 A | 11/1998 | Barnsley |
| 5,860,106 A | 1/1999 | Domen et al. |
| 5,867,114 A | 2/1999 | Barbir |
| 5,867,428 A | 2/1999 | Ishii et al. |
| 5,867,429 A | 2/1999 | Chen et al. |
| 5,877,986 A | 3/1999 | Harari et al. |
| 5,889,937 A | 3/1999 | Tamagawa |
| 5,901,089 A | 5/1999 | Korsh et al. |
| 5,909,449 A | 6/1999 | So et al. |
| 5,912,906 A | 6/1999 | Wu et al. |
| 5,930,167 A | 7/1999 | Lee et al. |
| 5,937,424 A | 8/1999 | Leak et al. |
| 5,942,004 A | 8/1999 | Cappelletti |
| 5,946,716 A | 8/1999 | Karp et al. |
| 5,969,986 A | 10/1999 | Wong et al. |
| 5,982,668 A | 11/1999 | Ishii et al. |
| 5,991,517 A | 11/1999 | Harari et al. |
| 5,995,417 A | 11/1999 | Chen et al. |
| 6,009,014 A | 12/1999 | Hollmer et al. |
| 6,009,016 A | 12/1999 | Ishii et al. |
| 6,023,425 A | 2/2000 | Ishii et al. |
| 6,034,891 A | 3/2000 | Norman |
| 6,040,993 A | 3/2000 | Chen et al. |
| 6,041,430 A | 3/2000 | Yamauchi |
| 6,073,204 A | 6/2000 | Lakhani et al. |
| 6,101,614 A | 8/2000 | Gonzales et al. |
| 6,128,237 A | 10/2000 | Shirley et al. |
| 6,134,140 A | 10/2000 | Tanaka et al. |
| 6,134,143 A | 10/2000 | Norman |
| 6,134,631 A | 10/2000 | Jennings |
| 6,141,261 A | 10/2000 | Patti |
| 6,151,246 A | 11/2000 | So et al. |
| 6,157,573 A | 12/2000 | Ishii et al. |
| 6,166,962 A | 12/2000 | Chen et al. |
| 6,169,691 B1 | 1/2001 | Pasotti et al. |
| 6,178,466 B1 | 1/2001 | Gilbertson et al. |
| 6,185,134 B1 | 2/2001 | Tanaka et al. |
| 6,209,113 B1 | 3/2001 | Roohparvar |
| 6,212,654 B1 | 4/2001 | Lou et al. |
| 6,219,276 B1 | 4/2001 | Parker |
| 6,219,447 B1 | 4/2001 | Lee et al. |
| 6,222,762 B1 | 4/2001 | Guterman et al. |
| 6,230,233 B1 | 5/2001 | Lofgren et al. |
| 6,240,458 B1 | 5/2001 | Gilbertson |
| 6,259,627 B1 | 7/2001 | Wong |
| 6,275,419 B1 | 8/2001 | Guterman et al. |
| 6,278,632 B1 | 8/2001 | Chevallier |
| 6,279,069 B1 | 8/2001 | Robinson et al. |
| 6,288,944 B1 | 9/2001 | Kawamura |
| 6,292,394 B1 | 9/2001 | Cohen et al. |
| 6,301,151 B1 | 10/2001 | Engh et al. |
| 6,304,486 B1 | 10/2001 | Yano |
| 6,307,776 B1 | 10/2001 | So et al. |
| 6,314,044 B1 | 11/2001 | Sasaki et al. |
| 6,317,363 B1 | 11/2001 | Guterman et al. |
| 6,317,364 B1 | 11/2001 | Guterman et al. |
| 6,345,004 B1 | 2/2002 | Omura et al. |
| 6,360,346 B1 | 3/2002 | Miyauchi et al. |
| 6,363,008 B1 | 3/2002 | Wong |
| 6,363,454 B1 | 3/2002 | Lakhani et al. |
| 6,366,496 B1 | 4/2002 | Torelli et al. |
| 6,385,092 B1 | 5/2002 | Ishii et al. |
| 6,392,932 B1 | 5/2002 | Ishii et al. |
| 6,396,742 B1 | 5/2002 | Korsh et al. |
| 6,397,364 B1 | 5/2002 | Barkan |
| 6,405,323 B1 | 6/2002 | Lin et al. |
| 6,405,342 B1 | 6/2002 | Lee |
| 6,418,060 B1 | 7/2002 | Yong et al. |
| 6,442,585 B1 | 8/2002 | Dean et al. |
| 6,445,602 B1 | 9/2002 | Kokudo et al. |
| 6,452,838 B1 | 9/2002 | Ishii et al. |
| 6,456,528 B1 | 9/2002 | Chen |
| 6,466,476 B1 | 10/2002 | Wong et al. |
| 6,467,062 B1 | 10/2002 | Barkan |
| 6,469,931 B1 | 10/2002 | Ban et al. |
| 6,480,948 B1 | 11/2002 | Virajpet et al. |
| 6,490,236 B1 | 12/2002 | Fukuda et al. |
| 6,522,580 B2 | 2/2003 | Chen et al. |
| 6,525,952 B2 | 2/2003 | Araki et al. |
| 6,532,556 B1 | 3/2003 | Wong et al. |
| 6,538,922 B1 | 3/2003 | Khalid et al. |
| 6,549,464 B2 | 4/2003 | Tanaka et al. |
| 6,553,510 B1 | 4/2003 | Pekny |
| 6,558,967 B1 | 5/2003 | Wong |
| 6,560,152 B1 | 5/2003 | Cernea |
| 6,567,311 B2 | 5/2003 | Ishii et al. |
| 6,577,539 B2 | 6/2003 | Iwahashi |
| 6,584,012 B2 | 6/2003 | Banks |
| 6,615,307 B1 | 9/2003 | Roohparvar |
| 6,621,739 B2 | 9/2003 | Gonzalez et al. |
| 6,640,326 B1 | 10/2003 | Buckingham et al. |
| 6,643,169 B2 | 11/2003 | Rudelic et al. |
| 6,646,913 B2 | 11/2003 | Micheloni et al. |
| 6,678,192 B2 | 1/2004 | Gongwer et al. |
| 6,683,811 B2 | 1/2004 | Ishii et al. |
| 6,687,155 B2 | 2/2004 | Nagasue |
| 6,707,748 B2 | 3/2004 | Lin et al. |
| 6,708,257 B2 | 3/2004 | Bao |
| 6,714,449 B2 | 3/2004 | Khalid |
| 6,717,847 B2 | 4/2004 | Chen |
| 6,731,557 B2 | 5/2004 | Beretta |
| 6,732,250 B2 | 5/2004 | Durrant |
| 6,738,293 B1 | 5/2004 | Iwahashi |
| 6,751,766 B2 | 6/2004 | Guterman et al. |
| 6,757,193 B2 | 6/2004 | Chen et al. |
| 6,774,808 B1 | 8/2004 | Hibbs et al. |
| 6,781,877 B2 | 8/2004 | Cernea et al. |
| 6,804,805 B2 | 10/2004 | Rub |
| 6,807,095 B2 | 10/2004 | Chen et al. |
| 6,807,101 B2 | 10/2004 | Ooishi et al. |
| 6,809,964 B2 | 10/2004 | Moschopoulos et al. |
| 6,819,592 B2 | 11/2004 | Noguchi et al. |
| 6,829,167 B2 | 12/2004 | Tu et al. |
| 6,845,052 B1 | 1/2005 | Ho et al. |
| 6,851,018 B2 | 2/2005 | Wyatt et al. |
| 6,851,081 B2 | 2/2005 | Yamamoto |
| 6,856,546 B2 | 2/2005 | Guterman et al. |
| 6,862,218 B2 | 3/2005 | Guterman et al. |
| 6,870,767 B2 | 3/2005 | Rudelic et al. |
| 6,870,773 B2 | 3/2005 | Noguchi et al. |
| 6,873,552 B2 | 3/2005 | Ishii et al. |
| 6,879,520 B2 | 4/2005 | Hosono et al. |

| Patent | Type | Date | Inventor |
|---|---|---|---|
| 6,882,567 | B1 | 4/2005 | Wong |
| 6,894,926 | B2 | 5/2005 | Guterman et al. |
| 6,907,497 | B2 | 6/2005 | Hosono et al. |
| 6,925,009 | B2 | 8/2005 | Noguchi et al. |
| 6,930,925 | B2 | 8/2005 | Guo et al. |
| 6,934,188 | B2 | 8/2005 | Roohparvar |
| 6,937,511 | B2 | 8/2005 | Hsu et al. |
| 6,958,938 | B2 | 10/2005 | Noguchi et al. |
| 6,963,505 | B2 | 11/2005 | Cohen |
| 6,972,993 | B2 | 12/2005 | Conley et al. |
| 6,988,175 | B2 | 1/2006 | Lasser |
| 6,992,932 | B2 | 1/2006 | Cohen |
| 6,999,344 | B2 | 2/2006 | Hosono et al. |
| 7,002,843 | B2 | 2/2006 | Guterman et al. |
| 7,006,379 | B2 | 2/2006 | Noguchi et al. |
| 7,012,835 | B2 | 3/2006 | Gonzales et al. |
| 7,020,017 | B2 | 3/2006 | Chen et al. |
| 7,023,735 | B2 | 4/2006 | Ban et al. |
| 7,031,210 | B2 | 4/2006 | Park et al. |
| 7,031,214 | B2 | 4/2006 | Tran |
| 7,031,216 | B2 | 4/2006 | You |
| 7,039,846 | B2 | 5/2006 | Hewitt et al. |
| 7,042,766 | B1 | 5/2006 | Wang et al. |
| 7,054,193 | B1 | 5/2006 | Wong |
| 7,054,199 | B2 | 5/2006 | Lee et al. |
| 7,057,958 | B2 | 6/2006 | So et al. |
| 7,065,147 | B2 | 6/2006 | Ophir et al. |
| 7,068,539 | B2 | 6/2006 | Guterman et al. |
| 7,071,849 | B2 | 7/2006 | Zhang |
| 7,072,222 | B2 | 7/2006 | Ishii et al. |
| 7,079,555 | B2 | 7/2006 | Baydar et al. |
| 7,088,615 | B2 | 8/2006 | Guterman et al. |
| 7,099,194 | B2 | 8/2006 | Tu et al. |
| 7,102,924 | B2 | 9/2006 | Chen et al. |
| 7,113,432 | B2 | 9/2006 | Mokhlesi |
| 7,130,210 | B2 | 10/2006 | Bathul et al. |
| 7,139,192 | B1 | 11/2006 | Wong |
| 7,139,198 | B2 | 11/2006 | Guterman et al. |
| 7,145,805 | B2 | 12/2006 | Ishii et al. |
| 7,151,692 | B2 | 12/2006 | Wu |
| 7,158,058 | B1 | 1/2007 | Yu |
| 7,170,781 | B2 | 1/2007 | So et al. |
| 7,170,802 | B2 | 1/2007 | Cernea et al. |
| 7,173,859 | B2 | 2/2007 | Hemink |
| 7,177,184 | B2 | 2/2007 | Chen |
| 7,177,195 | B2 | 2/2007 | Gonzales et al. |
| 7,177,199 | B2 | 2/2007 | Chen et al. |
| 7,177,200 | B2 | 2/2007 | Ronen et al. |
| 7,184,338 | B2 | 2/2007 | Nakagawa et al. |
| 7,187,195 | B2 | 3/2007 | Kim |
| 7,187,592 | B2 | 3/2007 | Guterman et al. |
| 7,190,614 | B2 | 3/2007 | Wu |
| 7,193,898 | B2 | 3/2007 | Cernea |
| 7,193,921 | B2 | 3/2007 | Choi et al. |
| 7,196,644 | B1 | 3/2007 | Anderson et al. |
| 7,196,928 | B2 | 3/2007 | Chen |
| 7,196,933 | B2 | 3/2007 | Shibata |
| 7,197,594 | B2 | 3/2007 | Raz et al. |
| 7,200,062 | B2 | 4/2007 | Kinsely et al. |
| 7,210,077 | B2 | 4/2007 | Brandenberger et al. |
| 7,221,592 | B2 | 5/2007 | Nazarian |
| 7,224,613 | B2 | 5/2007 | Chen et al. |
| 7,231,474 | B1 | 6/2007 | Helms et al. |
| 7,231,562 | B2 | 6/2007 | Ohlhoff et al. |
| 7,243,275 | B2 | 7/2007 | Gongwer et al. |
| 7,254,690 | B2 | 8/2007 | Rao |
| 7,254,763 | B2 | 8/2007 | Aadsen et al. |
| 7,257,027 | B2 | 8/2007 | Park |
| 7,259,987 | B2 | 8/2007 | Chen et al. |
| 7,266,026 | B2 | 9/2007 | Gongwer et al. |
| 7,266,069 | B2 | 9/2007 | Chu |
| 7,269,066 | B2 | 9/2007 | Nguyen et al. |
| 7,272,757 | B2 | 9/2007 | Stocken |
| 7,274,611 | B2 | 9/2007 | Roohparvar |
| 7,277,355 | B2 | 10/2007 | Tanzana |
| 7,280,398 | B1 | 10/2007 | Lee et al. |
| 7,280,409 | B2 | 10/2007 | Misumi et al. |
| 7,280,415 | B2 | 10/2007 | Hwang et al. |
| 7,283,399 | B2 | 10/2007 | Ishii et al. |
| 7,289,344 | B2 | 10/2007 | Chen |
| 7,301,807 | B2 | 11/2007 | Khalid et al. |
| 7,301,817 | B2 | 11/2007 | Li et al. |
| 7,308,525 | B2 | 12/2007 | Lasser et al. |
| 7,310,255 | B2 | 12/2007 | Chan |
| 7,310,269 | B2 | 12/2007 | Shibata |
| 7,310,271 | B2 | 12/2007 | Lee |
| 7,310,272 | B1 | 12/2007 | Mokhlesi et al. |
| 7,310,347 | B2 | 12/2007 | Lasser |
| 7,312,727 | B1 | 12/2007 | Feng et al. |
| 7,321,509 | B2 | 1/2008 | Chen et al. |
| 7,328,384 | B1 | 2/2008 | Kulkarni et al. |
| 7,342,831 | B2 | 3/2008 | Mokhlesi et al. |
| 7,343,330 | B1 | 3/2008 | Boesjes et al. |
| 7,345,924 | B2 | 3/2008 | Nguyen et al. |
| 7,345,928 | B2 | 3/2008 | Li |
| 7,349,263 | B2 | 3/2008 | Kim et al. |
| 7,356,755 | B2 | 4/2008 | Fackenthal |
| 7,363,420 | B2 | 4/2008 | Lin et al. |
| 7,365,671 | B1 | 4/2008 | Anderson |
| 7,388,781 | B2 | 6/2008 | Litsyn et al. |
| 7,397,697 | B2 | 7/2008 | So et al. |
| 7,405,974 | B2 | 7/2008 | Yaoi et al. |
| 7,405,979 | B2 | 7/2008 | Ishii et al. |
| 7,408,804 | B2 | 8/2008 | Hemink et al. |
| 7,408,810 | B2 | 8/2008 | Aritome et al. |
| 7,409,473 | B2 | 8/2008 | Conley et al. |
| 7,409,623 | B2 | 8/2008 | Baker et al. |
| 7,420,847 | B2 | 9/2008 | Li |
| 7,433,231 | B2 | 10/2008 | Aritome |
| 7,433,697 | B2 | 10/2008 | Karaoguz et al. |
| 7,434,111 | B2 | 10/2008 | Sugiura et al. |
| 7,437,498 | B2 | 10/2008 | Ronen |
| 7,440,324 | B2 | 10/2008 | Mokhlesi |
| 7,440,331 | B2 | 10/2008 | Hemink |
| 7,441,067 | B2 | 10/2008 | Gorobetz et al. |
| 7,447,970 | B2 | 11/2008 | Wu et al. |
| 7,450,421 | B2 | 11/2008 | Mokhlesi et al. |
| 7,453,737 | B2 | 11/2008 | Ha |
| 7,457,163 | B2 | 11/2008 | Hemink |
| 7,457,897 | B1 | 11/2008 | Lee et al. |
| 7,460,410 | B2 | 12/2008 | Nagai et al. |
| 7,460,412 | B2 | 12/2008 | Lee et al. |
| 7,466,592 | B2 | 12/2008 | Mitani et al. |
| 7,468,907 | B2 | 12/2008 | Kang et al. |
| 7,468,911 | B2 | 12/2008 | Lutze et al. |
| 7,469,049 | B1 | 12/2008 | Feng |
| 7,471,581 | B2 | 12/2008 | Tran et al. |
| 7,483,319 | B2 | 1/2009 | Brown |
| 7,487,329 | B2 | 2/2009 | Hepkin et al. |
| 7,487,394 | B2 | 2/2009 | Forhan et al. |
| 7,492,641 | B2 | 2/2009 | Hosono et al. |
| 7,508,710 | B2 | 3/2009 | Mokhlesi |
| 7,526,711 | B2 | 4/2009 | Orio |
| 7,539,061 | B2 | 5/2009 | Lee |
| 7,539,062 | B2 | 5/2009 | Doyle |
| 7,551,492 | B2 | 6/2009 | Kim |
| 7,558,109 | B2 | 7/2009 | Brandman et al. |
| 7,558,839 | B1 | 7/2009 | McGovern |
| 7,568,135 | B2 | 7/2009 | Cornwell et al. |
| 7,570,520 | B2 | 8/2009 | Kamei et al. |
| 7,574,555 | B2 | 8/2009 | Porat et al. |
| 7,590,002 | B2 | 9/2009 | Mokhlesi et al. |
| 7,593,259 | B2 | 9/2009 | Kim |
| 7,594,093 | B1 | 9/2009 | Kancherla |
| 7,596,707 | B1 | 9/2009 | Vemula |
| 7,609,787 | B2 | 10/2009 | Jahan et al. |
| 7,613,043 | B2 | 11/2009 | Cornwell et al. |
| 7,616,498 | B2 | 11/2009 | Mokhlesi et al. |
| 7,619,918 | B2 | 11/2009 | Aritome |
| 7,631,245 | B2 | 12/2009 | Lasser |
| 7,633,798 | B2 | 12/2009 | Sarin et al. |
| 7,633,802 | B2 | 12/2009 | Mokhlesi |
| 7,639,532 | B2 | 12/2009 | Roohparvar et al. |
| 7,644,347 | B2 | 1/2010 | Alexander et al. |
| 7,656,734 | B2 | 2/2010 | Thorp et al. |
| 7,660,158 | B2 | 2/2010 | Aritome |
| 7,660,183 | B2 | 2/2010 | Ware et al. |
| 7,661,000 | B2 | 2/2010 | Ueda et al. |

| Patent/Publication | Date | Inventor(s) |
|---|---|---|
| 7,661,054 B2 | 2/2010 | Huffman et al. |
| 7,665,007 B2 | 2/2010 | Yang et al. |
| 7,680,987 B1 | 3/2010 | Clark et al. |
| 7,733,712 B1 | 6/2010 | Walston et al. |
| 7,742,351 B2 | 6/2010 | Inoue et al. |
| 7,761,624 B2 | 7/2010 | Karamcheti et al. |
| 7,797,609 B2 | 9/2010 | Neuman |
| 7,810,017 B2 | 10/2010 | Radke |
| 7,848,149 B2 | 12/2010 | Gonzalez et al. |
| 7,869,273 B2 | 1/2011 | Lee et al. |
| 7,885,119 B2 | 2/2011 | Li |
| 7,904,783 B2 | 3/2011 | Brandman et al. |
| 7,928,497 B2 | 4/2011 | Yaegashi |
| 7,929,549 B1 | 4/2011 | Talbot |
| 7,930,515 B2 | 4/2011 | Gupta et al. |
| 7,945,825 B2 | 5/2011 | Cohen et al. |
| 7,978,516 B2 | 7/2011 | Olbrich et al. |
| 8,014,094 B1 | 9/2011 | Jin |
| 8,023,335 B2 * | 9/2011 | Kang ................ 365/185.25 |
| 8,037,380 B2 | 10/2011 | Cagno et al. |
| 8,040,744 B2 | 10/2011 | Gorobets et al. |
| 8,065,583 B2 | 11/2011 | Radke |
| 2001/0002172 A1 | 5/2001 | Tanaka et al. |
| 2001/0006479 A1 | 7/2001 | Ikehashi et al. |
| 2002/0038440 A1 | 3/2002 | Barkan |
| 2002/0056064 A1 | 5/2002 | Kidorf et al. |
| 2002/0118574 A1 | 8/2002 | Gongwer et al. |
| 2002/0133684 A1 | 9/2002 | Anderson |
| 2002/0166091 A1 | 11/2002 | Kidorf et al. |
| 2002/0174295 A1 | 11/2002 | Ulrich et al. |
| 2002/0196510 A1 | 12/2002 | Hietala et al. |
| 2003/0002348 A1 | 1/2003 | Chen et al. |
| 2003/0103400 A1 | 6/2003 | Van Tran |
| 2003/0161183 A1 | 8/2003 | Van Tran |
| 2003/0189856 A1 | 10/2003 | Cho et al. |
| 2004/0057265 A1 | 3/2004 | Mirabel et al. |
| 2004/0057285 A1 | 3/2004 | Cernea et al. |
| 2004/0083333 A1 | 4/2004 | Chang et al. |
| 2004/0083334 A1 | 4/2004 | Chang et al. |
| 2004/0105311 A1 | 6/2004 | Cernea et al. |
| 2004/0114437 A1 | 6/2004 | Li |
| 2004/0160842 A1 | 8/2004 | Fukiage |
| 2004/0223371 A1 | 11/2004 | Roohparvar |
| 2005/0007802 A1 | 1/2005 | Gerpheide |
| 2005/0013165 A1 | 1/2005 | Ban |
| 2005/0024941 A1 | 2/2005 | Lasser et al. |
| 2005/0024978 A1 | 2/2005 | Ronen |
| 2005/0030788 A1 | 2/2005 | Parkinson et al. |
| 2005/0086574 A1 | 4/2005 | Fackenthal |
| 2005/0121436 A1 | 6/2005 | Kamitani et al. |
| 2005/0144361 A1 | 6/2005 | Gonzalez et al. |
| 2005/0157555 A1 | 7/2005 | Ono et al. |
| 2005/0162913 A1 | 7/2005 | Chen |
| 2005/0169051 A1 | 8/2005 | Khalid et al. |
| 2005/0189649 A1 | 9/2005 | Maruyama et al. |
| 2005/0213393 A1 | 9/2005 | Lasser |
| 2005/0224853 A1 | 10/2005 | Ohkawa |
| 2005/0240745 A1 | 10/2005 | Iyer et al. |
| 2005/0243626 A1 | 11/2005 | Ronen |
| 2006/0004952 A1 | 1/2006 | Lasser |
| 2006/0028875 A1 | 2/2006 | Avraham et al. |
| 2006/0028877 A1 | 2/2006 | Meir |
| 2006/0101193 A1 | 5/2006 | Murin |
| 2006/0106972 A1 | 5/2006 | Gorobets et al. |
| 2006/0107136 A1 | 5/2006 | Gongwer et al. |
| 2006/0129750 A1 | 6/2006 | Lee et al. |
| 2006/0133141 A1 | 6/2006 | Gorobets |
| 2006/0156189 A1 | 7/2006 | Tomlin |
| 2006/0179334 A1 | 8/2006 | Brittain et al. |
| 2006/0190699 A1 | 8/2006 | Lee |
| 2006/0203546 A1 | 9/2006 | Lasser |
| 2006/0218359 A1 | 9/2006 | Sanders et al. |
| 2006/0221692 A1 | 10/2006 | Chen |
| 2006/0221705 A1 | 10/2006 | Hemink et al. |
| 2006/0221714 A1 | 10/2006 | Li et al. |
| 2006/0239077 A1 | 10/2006 | Park et al. |
| 2006/0239081 A1 | 10/2006 | Roohparvar |
| 2006/0256620 A1 | 11/2006 | Nguyen et al. |
| 2006/0256626 A1 | 11/2006 | Werner et al. |
| 2006/0256891 A1 | 11/2006 | Yuan et al. |
| 2006/0271748 A1 | 11/2006 | Jain et al. |
| 2006/0285392 A1 | 12/2006 | Incarnati et al. |
| 2006/0285396 A1 | 12/2006 | Ha |
| 2007/0006013 A1 | 1/2007 | Moshayedi et al. |
| 2007/0019481 A1 | 1/2007 | Park |
| 2007/0033581 A1 | 2/2007 | Tomlin et al. |
| 2007/0047314 A1 | 3/2007 | Goda et al. |
| 2007/0047326 A1 | 3/2007 | Nguyen et al. |
| 2007/0050536 A1 | 3/2007 | Kolokowsky |
| 2007/0058446 A1 | 3/2007 | Hwang et al. |
| 2007/0061502 A1 | 3/2007 | Lasser et al. |
| 2007/0067667 A1 | 3/2007 | Ikeuchi et al. |
| 2007/0074093 A1 | 3/2007 | Lasser |
| 2007/0086239 A1 | 4/2007 | Litsyn et al. |
| 2007/0086260 A1 | 4/2007 | Sinclair |
| 2007/0089034 A1 | 4/2007 | Litsyn et al. |
| 2007/0091677 A1 | 4/2007 | Lasser et al. |
| 2007/0091694 A1 | 4/2007 | Lee et al. |
| 2007/0103978 A1 | 5/2007 | Conley et al. |
| 2007/0103986 A1 | 5/2007 | Chen |
| 2007/0104211 A1 | 5/2007 | Opsasnick |
| 2007/0109845 A1 | 5/2007 | Chen |
| 2007/0109849 A1 | 5/2007 | Chen |
| 2007/0115726 A1 | 5/2007 | Cohen et al. |
| 2007/0118713 A1 | 5/2007 | Guterman et al. |
| 2007/0143378 A1 | 6/2007 | Gorobetz |
| 2007/0143531 A1 | 6/2007 | Atri |
| 2007/0159889 A1 | 7/2007 | Kang et al. |
| 2007/0159892 A1 | 7/2007 | Kang et al. |
| 2007/0159907 A1 | 7/2007 | Kwak |
| 2007/0168837 A1 | 7/2007 | Murin |
| 2007/0171714 A1 | 7/2007 | Wu et al. |
| 2007/0183210 A1 | 8/2007 | Choi et al. |
| 2007/0189073 A1 | 8/2007 | Aritome |
| 2007/0195602 A1 | 8/2007 | Fong et al. |
| 2007/0206426 A1 | 9/2007 | Mokhlesi |
| 2007/0208904 A1 | 9/2007 | Hsieh et al. |
| 2007/0226599 A1 | 9/2007 | Motwani |
| 2007/0236990 A1 | 10/2007 | Aritome |
| 2007/0253249 A1 | 11/2007 | Kang et al. |
| 2007/0256620 A1 | 11/2007 | Viggiano et al. |
| 2007/0263455 A1 | 11/2007 | Cornwell et al. |
| 2007/0266232 A1 | 11/2007 | Rodgers et al. |
| 2007/0271424 A1 | 11/2007 | Lee et al. |
| 2007/0280000 A1 | 12/2007 | Fujiu et al. |
| 2007/0291571 A1 | 12/2007 | Balasundaram |
| 2007/0297234 A1 | 12/2007 | Cernea et al. |
| 2008/0010395 A1 | 1/2008 | Mylly et al. |
| 2008/0025121 A1 | 1/2008 | Tanzawa |
| 2008/0043535 A1 | 2/2008 | Roohparvar |
| 2008/0049504 A1 | 2/2008 | Kasahara et al. |
| 2008/0049506 A1 | 2/2008 | Guterman |
| 2008/0052446 A1 | 2/2008 | Lasser et al. |
| 2008/0055993 A1 | 3/2008 | Lee |
| 2008/0080243 A1 | 4/2008 | Edahiro et al. |
| 2008/0082730 A1 | 4/2008 | Kim et al. |
| 2008/0089123 A1 | 4/2008 | Chae et al. |
| 2008/0104309 A1 | 5/2008 | Cheon et al. |
| 2008/0104312 A1 | 5/2008 | Lasser |
| 2008/0109590 A1 | 5/2008 | Jung et al. |
| 2008/0115017 A1 | 5/2008 | Jacobson |
| 2008/0123420 A1 | 5/2008 | Brandman et al. |
| 2008/0123426 A1 | 5/2008 | Lutze et al. |
| 2008/0126686 A1 | 5/2008 | Sokolov et al. |
| 2008/0130341 A1 | 6/2008 | Shalvi et al. |
| 2008/0148115 A1 | 6/2008 | Sokolov et al. |
| 2008/0151618 A1 | 6/2008 | Sharon et al. |
| 2008/0151667 A1 | 6/2008 | Miu et al. |
| 2008/0158958 A1 | 7/2008 | Sokolov et al. |
| 2008/0181001 A1 | 7/2008 | Shalvi |
| 2008/0198650 A1 | 8/2008 | Shalvi et al. |
| 2008/0198654 A1 | 8/2008 | Toda |
| 2008/0209116 A1 | 8/2008 | Caulkins |
| 2008/0209304 A1 | 8/2008 | Winarski et al. |
| 2008/0215798 A1 | 9/2008 | Sharon et al. |
| 2008/0217598 A1 | 9/2008 | Sharon et al. |
| 2008/0219050 A1 | 9/2008 | Shalvi et al. |
| 2008/0239093 A1 | 10/2008 | Easwar et al. |

| | | | |
|---|---|---|---|
| 2008/0239812 A1 | 10/2008 | Abiko et al. | |
| 2008/0253188 A1 | 10/2008 | Aritome | |
| 2008/0263262 A1 | 10/2008 | Sokolov et al. | |
| 2008/0263676 A1 | 10/2008 | Mo et al. | |
| 2008/0270730 A1 | 10/2008 | Lasser et al. | |
| 2008/0282106 A1 | 11/2008 | Shalvi et al. | |
| 2008/0288714 A1 | 11/2008 | Salomon et al. | |
| 2009/0003053 A1* | 1/2009 | Li et al. ............ | 365/185.02 |
| 2009/0013233 A1 | 1/2009 | Radke | |
| 2009/0024905 A1 | 1/2009 | Shalvi et al. | |
| 2009/0034337 A1 | 2/2009 | Aritome | |
| 2009/0043831 A1 | 2/2009 | Antonopoulos et al. | |
| 2009/0043951 A1 | 2/2009 | Shalvi et al. | |
| 2009/0049234 A1 | 2/2009 | Oh et al. | |
| 2009/0073762 A1 | 3/2009 | Lee et al. | |
| 2009/0086542 A1 | 4/2009 | Lee et al. | |
| 2009/0089484 A1 | 4/2009 | Chu | |
| 2009/0091979 A1 | 4/2009 | Shalvi | |
| 2009/0094930 A1 | 4/2009 | Schwoerer | |
| 2009/0106485 A1 | 4/2009 | Anholt | |
| 2009/0112949 A1 | 4/2009 | Ergan et al. | |
| 2009/0132755 A1 | 5/2009 | Radke | |
| 2009/0144600 A1 | 6/2009 | Perlmutter et al. | |
| 2009/0150894 A1 | 6/2009 | Huang et al. | |
| 2009/0157950 A1 | 6/2009 | Selinger | |
| 2009/0157964 A1 | 6/2009 | Kasorla et al. | |
| 2009/0158126 A1 | 6/2009 | Perlmutter et al. | |
| 2009/0168524 A1 | 7/2009 | Golov et al. | |
| 2009/0172257 A1 | 7/2009 | Prins et al. | |
| 2009/0172261 A1 | 7/2009 | Prins et al. | |
| 2009/0193184 A1 | 7/2009 | Yu et al. | |
| 2009/0199074 A1 | 8/2009 | Sommer et al. | |
| 2009/0204824 A1 | 8/2009 | Lin et al. | |
| 2009/0204872 A1 | 8/2009 | Yu et al. | |
| 2009/0213653 A1 | 8/2009 | Perlmutter et al. | |
| 2009/0213654 A1 | 8/2009 | Perlmutter et al. | |
| 2009/0225595 A1 | 9/2009 | Kim | |
| 2009/0228761 A1 | 9/2009 | Perlmutter et al. | |
| 2009/0240872 A1 | 9/2009 | Perlmutter et al. | |
| 2009/0265509 A1 | 10/2009 | Klein | |
| 2009/0300227 A1 | 12/2009 | Nochimowski et al. | |
| 2009/0323412 A1 | 12/2009 | Mokhlesi et al. | |
| 2009/0327608 A1 | 12/2009 | Eschmann | |
| 2010/0017650 A1 | 1/2010 | Chin et al. | |
| 2010/0034022 A1 | 2/2010 | Dutta et al. | |
| 2010/0057976 A1 | 3/2010 | Lasser | |
| 2010/0061151 A1 | 3/2010 | Miwa et al. | |
| 2010/0082883 A1 | 4/2010 | Chen et al. | |
| 2010/0083247 A1 | 4/2010 | Kanevsky et al. | |
| 2010/0110580 A1 | 5/2010 | Takashima | |
| 2010/0131697 A1 | 5/2010 | Alrod et al. | |
| 2010/0131826 A1* | 5/2010 | Shalvi et al. ............ | 714/763 |
| 2010/0142268 A1 | 6/2010 | Aritome | |
| 2010/0142277 A1 | 6/2010 | Yang et al. | |
| 2010/0169547 A1 | 7/2010 | Ou | |
| 2010/0169743 A1 | 7/2010 | Vogan et al. | |
| 2010/0174847 A1 | 7/2010 | Paley et al. | |
| 2010/0211803 A1 | 8/2010 | Lablans | |
| 2010/0287217 A1 | 11/2010 | Borchers et al. | |
| 2011/0010489 A1 | 1/2011 | Yeh | |
| 2011/0060969 A1 | 3/2011 | Ramamoorthy et al. | |
| 2011/0066793 A1 | 3/2011 | Burd | |
| 2011/0075482 A1 | 3/2011 | Shepard et al. | |
| 2011/0107049 A1 | 5/2011 | Kwon et al. | |
| 2011/0149657 A1 | 6/2011 | Haratsch et al. | |
| 2011/0199823 A1 | 8/2011 | Bar-Or et al. | |
| 2011/0302354 A1 | 12/2011 | Miller | |

FOREIGN PATENT DOCUMENTS

| | | |
|---|---|---|
| EP | 1605509 A1 | 12/2005 |
| WO | 9610256 A1 | 4/1996 |
| WO | 9828745 A1 | 7/1998 |
| WO | 2002100112 A1 | 12/2002 |
| WO | 03100791 A1 | 12/2003 |
| WO | 2007046084 A2 | 4/2007 |
| WO | 2007132452 A2 | 11/2007 |
| WO | 2007132453 A2 | 11/2007 |
| WO | 2007132456 A2 | 11/2007 |
| WO | 2007132457 A2 | 11/2007 |
| WO | 2007132458 A2 | 11/2007 |
| WO | 2007146010 A2 | 12/2007 |
| WO | 2008026203 A2 | 3/2008 |
| WO | 2008053472 A2 | 5/2008 |
| WO | 2008053473 A2 | 5/2008 |
| WO | 2008068747 A2 | 6/2008 |
| WO | 2008077284 A1 | 7/2008 |
| WO | 2008083131 A2 | 7/2008 |
| WO | 2008099958 A1 | 8/2008 |
| WO | 2008111058 A2 | 9/2008 |
| WO | 2008124760 A2 | 10/2008 |
| WO | 2008139441 A2 | 11/2008 |
| WO | 2009037691 A2 | 3/2009 |
| WO | 2009037697 A2 | 3/2009 |
| WO | 2009038961 A2 | 3/2009 |
| WO | 2009050703 A2 | 4/2009 |
| WO | 2009053961 A2 | 4/2009 |
| WO | 2009053962 A2 | 4/2009 |
| WO | 2009053963 A2 | 4/2009 |
| WO | 2009063450 A2 | 5/2009 |
| WO | 2009072100 A2 | 6/2009 |
| WO | 2009072101 A2 | 6/2009 |
| WO | 2009072102 A2 | 6/2009 |
| WO | 2009072103 A2 | 6/2009 |
| WO | 2009072104 A2 | 6/2009 |
| WO | 2009072105 A2 | 6/2009 |
| WO | 2009074978 A2 | 6/2009 |
| WO | 2009074979 A2 | 6/2009 |
| WO | 2009078006 A2 | 6/2009 |
| WO | 2009095902 A2 | 8/2009 |
| WO | 2011024015 A1 | 3/2011 |

OTHER PUBLICATIONS

U.S. Appl. No. 12/332,368 Office Action dated Nov. 10, 2011.
U.S. Appl. No. 12/063,544 Office Action dated Dec. 14, 2011.
U.S. Appl. No. 12/186,867 Office Action dated Jan. 17, 2012.
U.S. Appl. No. 12/119,069 Office Action dated Nov. 14, 2011.
U.S. Appl. No. 12/037,487 Office Action dated Jan. 3, 2012.
U.S. Appl. No. 11/995,812 Office Action dated Oct. 28, 2011.
U.S. Appl. No. 12/551,567 Office Action dated Oct. 27, 2011.
U.S. Appl. No. 12/618,732 Office Action dated Nov. 4, 2011.
U.S. Appl. No. 12/649,382 Office Action dated Jan. 6, 2012.
Kim et al., "Multi-bit Error Tolerant Caches Using Two-Dimensional Error Coding", Proceedings of the 40th Annual ACM/IEEE International Symposium on Microarchitecture (MICRO-40), Chicago, USA, Dec. 1-5, 2007.
U.S. Appl. No. 11/995,814 Official Action dated Dec. 17, 2010.
U.S. Appl. No. 12/388,528 Official Action dated Nov. 29, 2010.
U.S. Appl. No. 12/251,471 Official Action dated Jan. 3, 2011.
Engineering Windows 7, "Support and Q&A for Solid-State Drives", e7blog, May 5, 2009.
Micron Technology Inc., "Memory Management in NAND Flash Arrays", Technical Note, year 2005.
Kang et al., "A Superblock-based Flash Translation Layer for NAND Flash Memory", Proceedings of the 6th ACM & IEEE International Conference on Embedded Software, pp. 161-170, Seoul, Korea, Oct. 22-26, 2006.
Park et al., "Sub-Grouped Superblock Management for High-Performance Flash Storages", IEICE Electronics Express, vol. 6, No. 6, pp. 297-303, Mar. 25, 2009.
"How to Resolve "Bad Super Block: Magic Number Wrong" in BSD", Free Online Articles Director Article Base, posted Sep. 5, 2009.
UBUNTU Forums, "Memory Stick Failed IO Superblock", posted Nov. 11, 2009.
Super User Forums, "SD Card Failure, can't read superblock", posted Aug. 8, 2010.
Agrell et al., "Closest Point Search in Lattices", IEEE Transactions on Information Theory, vol. 48, No. 8, pp. 2201-2214, Aug. 2002.
Bez et al., "Introduction to Flash memory", Proceedings of the IEEE, vol. 91, No. 4, pp. 489-502, Apr. 2003.
Blahut, R.E., "Theory and Practice of Error Control Codes," Addison-Wesley, May, 1984, section 3.2, pp. 47-48.
Chang, L., "Hybrid Solid State Disks: Combining Heterogeneous NAND Flash in Large SSDs", ASPDAC, Jan. 2008.

Databahn™, "Flash memory controller IP", Denali Software, Inc., 1994 https://www.denali.com/en/products/databahn_flash.jsp.

Datalight, Inc., "FlashFX Pro 3.1 High Performance Flash Manager for Rapid Development of Reliable Products", Nov. 16, 2006.

Duann, N., Silicon Motion Presentation "SLC & MLC Hybrid", Flash Memory Summit, Santa Clara, USA, Aug. 2008.

Eitan et al., "Multilevel Flash Cells and their Trade-Offs", Proceedings of the 1996 IEEE International Electron Devices Meeting (IEDM), pp. 169-172, New York, USA 1996.

Engh et al., "A self adaptive programming method with 5 mV accuracy for multi-level storage in FLASH", pp. 115-118, Proceedings of the IEEE 2002 Custom Integrated Circuits Conference, May 12-15, 2002.

Goodman et al., "On-Chip ECC for Multi-Level Random Access Memories," Proceedings of the IEEE/CAM Information Theory Workshop, Ithaca, USA, Jun. 25-29, 1989.

Horstein, "On the Design of Signals for Sequential and Nonsequential Detection Systems with Feedback," IEEE Transactions on Information Theory IT-12:4 (Oct. 1966), pp. 448-455.

Jung et al., in "A 117 mm.sup.2 3.3V Only 128 Mb Multilevel NAND Flash Memory for Mass Storage Applications," IEEE Journal of Solid State Circuits, (11:31), Nov. 1996, pp. 1575-1583.

Kawaguchi et al. 1995. A flash-memory based file system. In Proceedings of the USENIX 1995 Technical Conference, New Orleans, Louisiana. 155-164.

Kim et al., "Future Memory Technology including Emerging New Memories", Proceedings of the 24th International Conference on Microelectronics (MIEL), vol. 1, pp. 377-384, Nis, Serbia and Montenegro, May 16-19, 2004.

Lee et al., "Effects of Floating Gate Interference on NAND Flash Memory Cell Operation", IEEE Electron Device Letters, vol. 23, No. 5, pp. 264-266, May 2002.

Maayan et al., "A 512 Mb NROM Flash Data Storage Memory with 8 MB/s Data Rate", Proceedings of the 2002 IEEE International Solid-State circuits Conference (ISSCC 2002), pp. 100-101, San Francisco, USA, Feb. 3-7, 2002.

Mielke et al., "Recovery Effects in the Distributed Cycling of Flash Memories", IEEE 44th Annual International Reliability Physics Symposium, pp. 29-35, San Jose, USA, Mar. 2006.

ONFI, "Open NAND Flash Interface Specification," revision 1.0, Dec. 28, 2006.

Phison Electronics Corporation, "PS8000 Controller Specification (for SD Card)", revision 1.2, Document No. S-07018, Mar. 28, 2007.

Shalvi, et al., "Signal Codes," Proceedings of the 2003 IEEE Information Theory Workshop (ITW'2003), Paris, France, Mar. 31-Apr. 4, 2003.

Shiozaki, A., "Adaptive Type-II Hybrid Broadcast ARQ System", IEEE Transactions on Communications, vol. 44, Issue 4, pp. 420-422, Apr. 1996.

Suh et al., "A 3.3V 32Mb NAND Flash Memory with Incremental Step Pulse Programming Scheme", IEEE Journal of Solid-State Circuits, vol. 30, No. 11, pp. 1149-1156, Nov. 1995.

ST Microelectronics, "Bad Block Management in NAND Flash Memories", Application note AN-1819, Geneva, Switzerland, May 2004.

ST Microelectronics, "Wear Leveling in Single Level Cell NAND Flash Memories," Application note AN-1822 Geneva, Switzerland, Feb. 2007.

Takeuchi et al., "A Double Level $V_{TH}$ Select Gate Array Architecture for Multi-Level NAND Flash Memories", Digest of Technical Papers, 1995 Symposium on VLSI Circuits, pp. 69-70, Jun. 8-10, 1995.

Takeuchi et al., "A Multipage Cell Architecture for High-Speed Programming Multilevel NAND Flash Memories", IEEE Journal of Solid State Circuits, vol. 33, No. 8, Aug. 1998, pp. 1228-1238.

Wu et al., "eNVy: A non-Volatile, Main Memory Storage System", Proceedings of the 6th International Conference on Architectural support for programming languages and operating systems, pp. 86-87, San Jose, USA, 1994.

International Application PCT/IL2007/000575 Patentability report dated Mar. 26, 2009.

International Application PCT/IL2007/000575 Search Report dated May 30, 2008.

International Application PCT/IL2007/000576 Patentability Report dated Mar. 19, 2009.

International Application PCT/IL2007/000576 Search Report dated Jul. 7, 2008.

International Application PCT/IL2007/000579 Patentability report dated, Mar. 19, 2009.

International Application PCT/IL2007/000579 Search report dated Jul. 3, 2008.

International Application PCT/IL2007/000580 Patentability Report dated, Mar. 19, 2009.

International Application PCT/IL2007/000580 Search Report dated Sep. 11, 2008.

International Application PCT/IL2007/000581 Patentability Report dated Mar. 26, 2009.

International Application PCT/IL2007/000581 Search Report dated Aug. 25, 2008.

International Application PCT/IL2007/001059 Patentability report dated Apr. 16, 2009.

International Application PCT/IL2007/001059 Search report dated Aug. 7, 2008.

International Application PCT/IL2007/001315 search report dated Aug. 7, 2008.

International Application PCT/IL2007/001315 Patentability Report dated May 5, 2009.

International Application PCT/IL2007/001316 Search Report dated Jul. 22, 2008.

International Application PCT/IL2007/001316 Patentability Report dated May 5, 2009.

International Application PCT/IL2007/001488 Search report dated Jun. 20, 2008.

International Application PCT/IL2008/000329 Search report dated Nov. 25, 2008.

International Application PCT/IL2008/000519 Search report dated Nov. 20, 2008.

International Application PCT/IL2008/001188 Search Report dated Jan. 28, 2009.

International Application PCT/IL2008/001356 Search Report dated Feb. 3, 2009.

International Application PCT/IL2008/001446 Search report dated Feb. 20, 2009.

U.S. Appl. No. 11/949,135 Official Action dated Oct. 2, 2009.

U.S. Appl. No. 12/019,011 Official Action dated Nov. 20, 2009.

Sommer, N., U.S. Appl. No. 12/171,797 "Memory Device with Non-Uniform Programming Levels" filed Jul. 11, 2008.

Shalvi et al., U.S. Appl. No. 12/251,471 "Compensation for Voltage Drifts in Analog Memory Cells" filed Oct. 15, 2008.

Sommer et al., U.S. Appl. No. 12/497,707 "Data Storage in Analog Memory Cells with Protection Against Programming Interruption" filed Jul. 6, 2009.

Winter et al., U.S. Appl. No. 12/534,893 "Improved Data Storage in Analog Memory Cells Using Modified Pass Voltages" filed Aug, 4, 2009.

Winter et al. U.S. Appl. No. 12/534,898 "Data Storage Using Modified Voltages" filed Aug. 4, 2009.

Shalvi et al., U.S. Appl. No. 12/551,583 "Segmented Data Storage" filed Sep. 1, 2009.

Shalvi et al., U.S. Appl. No. 12/551,567 "Reliable Data Storage in Analog Memory Cells Subjected to Long Retention Periods" filed Sep. 1, 2009.

Perlmutter et al., U.S. Appl. No. 12/558,528 "Estimation of Memory Cell Read Thresholds by Sampling Inside Programming Level Distribution Intervals" filed Sep. 13, 2009.

Sokolov, D., U.S. Appl. No. 12/579,430 "Efficient Programming of Analog Memory Cell Devices" filed Oct. 15, 2009.

Shalvi, O., U.S. Appl. No. 12/579,432 "Efficient Data Storage in Storage Device Arrays" filed Oct. 15, 2009.

Sommer et al., U.S. Appl. No. 12/607,078 "Data Scrambling in Memory Devices" filed Oct. 28, 2009.

Sommer et al., U.S. Appl. No. 12/607,085 "Data Scrambling Schemes for Memory Devices" filed Oct. 28, 2009.

Shalvi et al., U.S. Appl. No. 12/618,732 "Storage at M Bits/Cell Density in N Bits/Cell Analog Memory Cell Devices, M>N" filed Nov. 15, 2009.

Sommer et al., U.S. Appl. No. 12/649,358 "Efficient Readout Schemes for Analog Memory Cell Devices" filed Dec. 30, 2009.
Sommer et al., U.S. Appl. No. 12/649,360 "Efficient Readout Schemes for Analog Memory Cell Devices Using Multiple Read Threshold Sets" filed Dec. 30, 2009.
Rotbard et al., U.S. Appl. No. 12/649,382 "Rejuvenation of Analog Memory Cells" filed Dec. 30, 2009.
U.S. Appl. No. 12/323,544 Official Action dated Mar. 9, 2012.
Chinese Patent Application # 200780026181.3 Official Action dated Mar. 7, 2012.
Chinese Patent Application # 200780026094.8 Official Action dated Feb. 2, 2012.
U.S. Appl. No. 12/332,370 Official Action dated Mar. 8, 2012.
U.S. Appl. No. 12/579,432 Official Action dated Feb. 29, 2012.
U.S. Appl. No. 12/522,175 Official Action dated Mar. 27, 2012.
U.S. Appl. No. 12/607,085 Official Action dated Mar. 28, 2012.
Budilovsky et al., "Prototyping a High-Performance Low-Cost Solid-State Disk", SYSTOR—The 4th Annual International Systems and Storage Conference, Haifa, Israel, May 30-Jun. 1, 2011.
NVM Express Protocol, "NVM Express", Revision 1.0b, Jul. 12, 2011.
SCSI Protocol, "Information Technology—SCSI Architecture Model—5 (SAM-5)", INCITS document T10/2104-D, revision 01, Jan. 28, 2009.
SAS Protocol, "Information Technology—Serial Attached SCSI—2 (SAS-2)", INCITS document T10/1760-D, revision 15a, Feb. 22, 2009.
JEDEC Standard JESD84-C44, "Embedded MultiMediaCard (e•MMC) Mechanical Standard, with Optional Reset Signal", Jedec Solid State Technology Association, USA, Jul. 2009.
JEDEC, "UFS Specification", version 0.1, Nov. 11, 2009.
SD Group and SD Card Association, "SD Specifications Part 1 Physical Layer Specification", version 3.01, draft 1.00, Nov. 9, 2009.
Compaq et al., "Universal Serial Bus Specification", revision 2.0, Apr. 27, 2000.
Serial ATA International Organization, "Serial ATA Revision 3.0 Specification", Jun. 2, 2009.
Gotou, H., "An Experimental Confirmation of Automatic Threshold Voltage Convergence in a Flash Memory Using Alternating Word-Line Voltage Pulses", IEEE Electron Device Letters, vol. 18, No. 10, pp. 503-505, Oct. 1997.
U.S. Appl. No. 12/534,898 Official Action dated Mar. 23, 2011.
Ankolekar et al., "Multibit Error-Correction Methods for Latency-Constrained Flash Memory Systems", IEEE Transactions on Device and Materials Reliability, vol. 10, No. 1, pp. 33-39, Mar. 2010.
U.S. Appl. No. 12/344,233 Official Action dated Jun. 24, 2011.
U.S. Appl. No. 11/995,813 Official Action dated Jun. 16, 2011.
Berman et al., "Mitigating Inter-Cell Coupling Effects in MLC NAND Flash via Constrained Coding", Flash Memory Summit, Santa Clara, USA, Aug. 19, 2010.
U.S. Appl. No. 12/178,318 Official Action dated May 31, 2011.
CN Patent Application # 200780026181.3 Official Action dated Apr. 8, 2011.
Huffman, A., "Non-Volatile Memory Host Controller Interface (NVMHCI)", Specification 1.0, Apr. 14, 2008.
Panchbhai et al., "Improving Reliability of NAND Based Flash Memory Using Hybrid SLC/MLC Device", Project Proposal for CSci 8980—Advanced Storage Systems, University of Minnesota, USA, Spring 2009.
U.S. Appl. No. 11/957,970 Official Action dated May 20, 2010.
Shalvi et al., U.S. Appl. No. 12/822,207 "Adaptive Over-Provisioning in Memory Systems" filed Jun. 24, 2010.
Wei, L., "Trellis-Coded Modulation With Multidimensional Constellations", IEEE Transactions on Information Theory, vol. IT-33, No. 4, pp. 483-501, Jul. 1987.
U.S. Appl. No. 13/114,049 Official Action dated Sep 12, 2011.
U.S. Appl. No. 12/405,275 Official Action dated Jul. 29, 2011.
Conway et al., "Sphere Packings, Lattices and Groups", 3rd edition, chapter 4, pp. 94-135, Springer, New York, USA 1998.
Chinese Patent Application # 200780040493.X Official Action dated Jun. 15, 2011.
U.S. Appl. No. 12/037,487 Official Action dated Oct. 3, 2011.
U.S. Appl. No. 12/649,360 Official Action dated Aug. 9, 2011.
U.S. Appl. No. 12/880,101 "Reuse of Host Hibernation Storage Space by Memory Controller", filed Sep. 12, 2010.
U.S. Appl. No. 12/890,724 "Error Correction Coding Over Multiple Memory Pages", filed Sep. 27, 2010.
U.S. Appl. No. 12/171,797 Official Action dated Aug. 25, 2010.
U.S. Appl. No. 12/497,707 Official Action dated Sep. 15, 2010.
U.S. Appl. No. 11/995,801 Official Action dated Oct. 15, 2010.
Numonyx, "M25PE16: 16-Mbit, page-erasable serial flash memory with byte-alterability, 75 MHz SPI bus, standard pinout", Apr. 2008.
Hong et al., "NAND Flash-based Disk Cache Using SLC/MLC Combined Flash Memory", 2010 International Workshop on Storage Network Architecture and Parallel I/Os, pp. 21-30, USA, May 3, 2010.
U.S. Appl. No. 11/945,575 Official Action dated Aug. 24, 2010.
U.S. Appl. No. 12/045,520 Official Action dated Nov. 16, 2010.
US 7,161,836, 01/2007, Wan et al. (withdrawn)

* cited by examiner

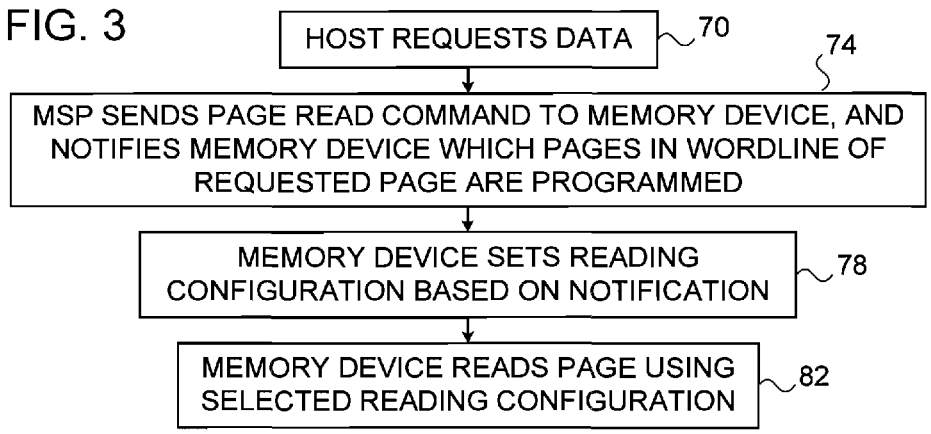
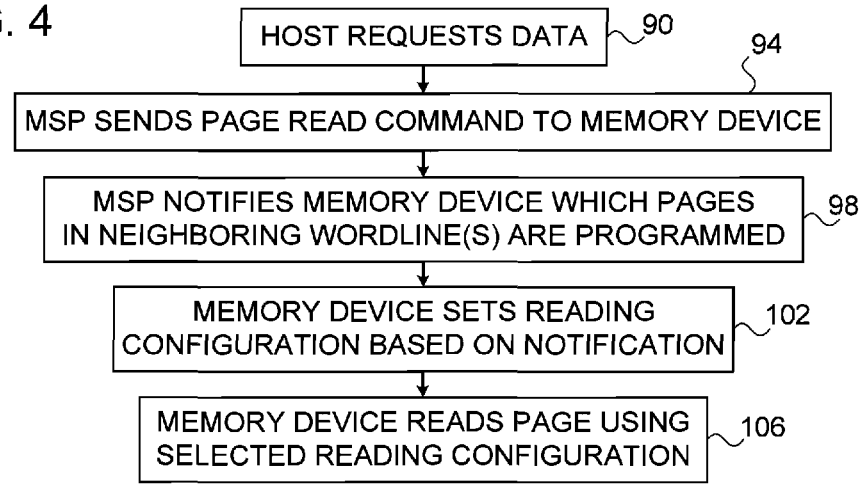
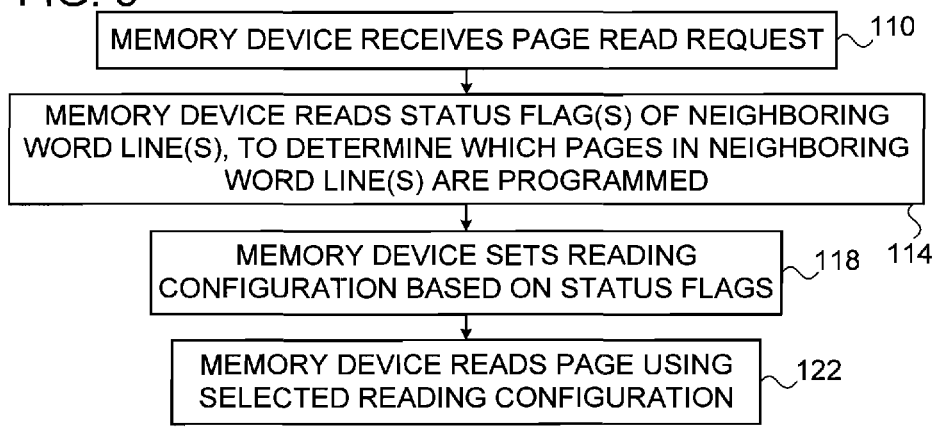

EFFICIENT READOUT SCHEMES FOR ANALOG MEMORY CELL DEVICES

CROSS-REFERENCE TO RELATED APPLICATIONS

This application claims the benefit of U.S. Provisional Patent Application 61/141,830, filed Dec. 31, 2008, U.S. Provisional Patent Application 61/256,200, filed Oct. 29, 2009, U.S. Provisional Patent Application 61/264,673, filed Nov. 26, 2009, and U.S. Provisional Patent Application 61/265,763, filed Dec. 2, 2009, whose disclosures are incorporated herein by reference. This application is related to a U.S. patent application entitled "Efficient Readout Schemes for Analog Memory Cell Devices Using Multiple Read Threshold Sets," filed on even date, which is assigned to the assignee of the present patent application and whose disclosure is incorporated herein by reference.

FIELD OF THE INVENTION

The present invention relates generally to memory devices, and particularly to methods and systems for reading data from analog memory cells.

BACKGROUND OF THE INVENTION

Several types of memory devices, such as Flash memories, use arrays of analog memory cells for storing data. Each analog memory cell stores a quantity of an analog value, also referred to as a storage value, such as an electrical charge or voltage. This analog value represents the information stored in the cell. In Flash memories, for example, each analog memory cell holds a certain amount of electrical charge. The range of possible analog values is typically divided into intervals, each interval corresponding to one or more data bit values. Data is written to an analog memory cell by writing a nominal analog value that corresponds to the desired bit or bits.

Some memory devices, commonly referred to as Single-Level Cell (SLC) devices, store a single bit of information in each memory cell, i.e., each memory cell can be programmed to assume either of two possible programming levels. Higher-density devices, often referred to as Multi-Level Cell (MLC) devices, store two or more bits per memory cell, i.e., can be programmed to assume more than two possible programming levels.

SUMMARY OF THE INVENTION

An embodiment of the present invention provides a method for data readout, including:

sending to a memory device, which includes a plurality of analog memory cells, a request to read a requested memory page that is stored in a first group of the memory cells;

reporting to the memory device a programming status of a second group of the memory cells, so as to cause the memory device to select a reading configuration responsively to the reported programming status and to read the requested memory page from the first group of the memory cells using the selected reading configuration; and receiving the requested memory page from the memory device.

In some embodiments, the second group of the memory cells is capable of storing one or more memory pages, and reporting the programming status includes indicating to the memory device which of the one or more memory pages have been programmed in the second group. In an embodiment, the first group equals the second group. In a disclosed embodiment, the memory cells in the first group and the memory cells in the second group are interleaved with one another in a given row of the memory device. In another embodiment, the memory cells in the first group are located in a first row of the memory device, and the memory cells in the second group are located in a second row of the memory device, different from the first row. In yet another embodiment, sending the request and reporting the programming status include sending from the controller to the memory device a single command, which includes the request and the programming status.

There is additionally provided, in accordance with an embodiment of the present invention, a method for data readout, including:

in a memory device that includes a plurality of analog memory cells, receiving from a controller a request to read a requested memory page that is stored in a first group of the memory cells, and an indication of a programming status of a second group of the memory cells;

selecting a reading configuration responsively to the indicated programming status;

reading the requested memory page from the first group of the memory cells using the selected reading configuration; and outputting the requested memory page to the controller.

In an embodiment, selecting the reading configuration includes modifying one or more read thresholds that are used in reading the requested memory page. In another embodiment, the first group is distinct from the second group, and selecting the reading configuration includes selectively activating, based on the indication, an interference cancellation process that cancels interference caused by the second group to the first group. In yet another embodiment, reading the requested memory page from the first group includes sensing the memory cells in the first group over a time period, and selecting the reading configuration includes modifying a duration of the time period. In still another embodiment, the requested memory page is encoded with an Error Correction Code (ECC), and selecting the reading configuration includes modifying an ECC decoding scheme used in decoding the ECC of the requested memory page.

There is also provided, in accordance with an embodiment of the present invention, a method for data readout, including:

in a memory device that includes a plurality of analog memory cells, receiving a request to read a requested memory page that is stored in a first group of the memory cells;

reading from the memory cells a programming status of a second group of the memory cells, different from the first group;

selecting a reading configuration responsively to the read programming status;

reading the requested memory page from the first group of the memory cells using the selected reading configuration; and outputting the requested memory page.

There is further provided, in accordance with an embodiment of the present invention, a data storage apparatus, including:

an interface, which is coupled to communicate with a memory device that includes a plurality of analog memory cells; and a processor, which is configured to send to the memory device via the interface a request to read a requested memory page that is stored in a first group of the memory cells, to report to the memory device a programming status of a second group of the memory cells, so as to cause the memory device to select a reading configuration responsively to the reported programming status and to read the requested memory page from the first group of the memory cells using the selected reading configuration, and to receive the requested memory page from the memory device.

There is also provided, in accordance with an embodiment of the present invention, a memory device, including:

a plurality of analog memory cells; and circuitry, which is configured to receive from a controller a request to read a requested memory page that is stored in a first group of the memory cells, and an indication of a programming status of a second group of the memory cells, to select a reading configuration responsively to the indicated programming status, to read the requested memory page from the first group of the memory cells using the selected reading configuration, and to output the requested memory page to the controller.

There is additionally provided, in accordance with an embodiment of the present invention a memory device, including:

a plurality of analog memory cells; and circuitry, which is configured to receive a request to read a requested memory page that is stored in a first group of the memory cells, to read from the memory cells a programming status of a second group of the memory cells, different from the first group, to select a reading configuration responsively to the read programming status, to read the requested memory page from the first group of the memory cells using the selected reading configuration, and to output the requested memory page.

The present invention will be more fully understood from the following detailed description of the embodiments thereof, taken together with the drawings in which:

BRIEF DESCRIPTION OF THE DRAWINGS

FIGS. 3-6 are flow charts that schematically illustrate methods for reading data from analog memory cells, in accordance with embodiments of the present invention.

DETAILED DESCRIPTION OF EMBODIMENTS

Overview

Figure 1:
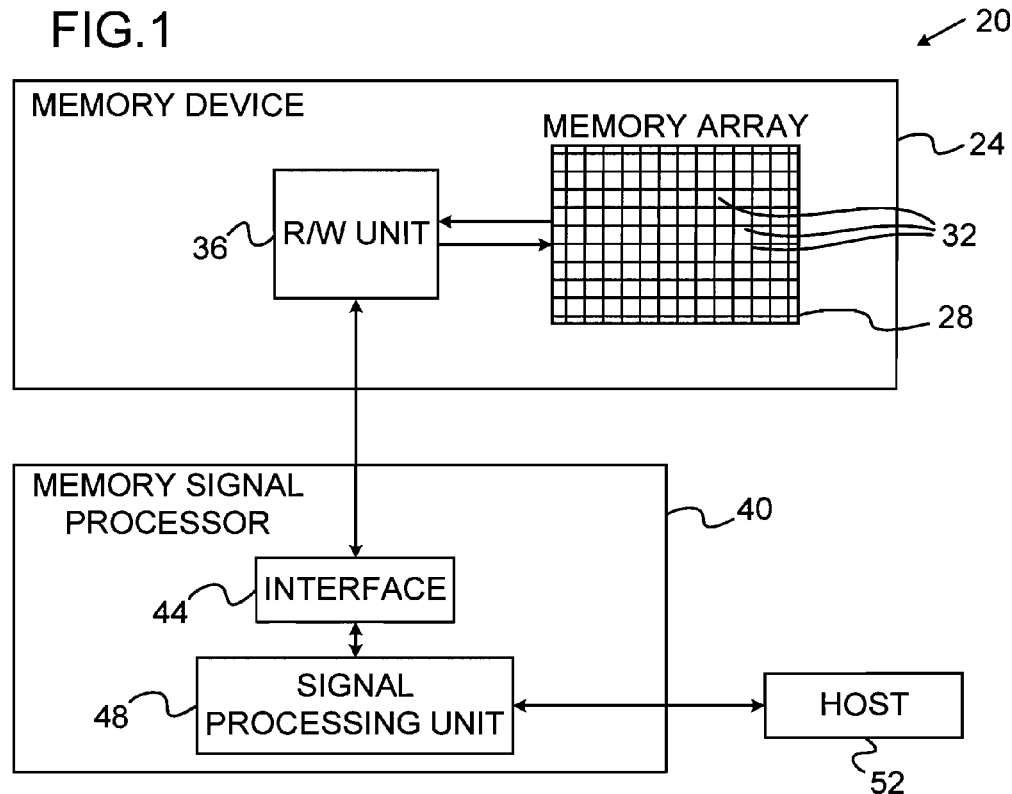
FIG. 1 is a block diagram that schematically illustrates a memory system, in accordance with an embodiment of the present invention.

Embodiments of the present invention that are described hereinbelow provide improved methods and systems for data readout from analog memory cells. In some embodiments, a memory system comprises a memory controller and a memory device that includes multiple analog memory cells. The controller and the memory device support an interface, over which the controller notifies the memory device of the programming status of certain groups of memory cells. For example, when the memory cells are arranged in word lines, each word line storing multiple memory pages, the programming status of a given word line can indicate which memory pages are actually programmed in this word line. When reading a requested memory page from a group of memory cells, the memory device selects an appropriate reading configuration based on the programming status reported by the controller.

In some embodiments, the controller indicates to the memory device the programming status of the same group of memory cells (e.g., word line) from which the requested page is to be read. This technique reduces the readout time, because the memory device does not need to determine the programming status by reading the memory cells. The memory device may modify various properties of the readout process, such as the positions of read thresholds, based on the reported programming status.

In another disclosed method, when intending to read a memory page from a given group of memory cells, the controller indicates to the memory device the programming status of one or more neighboring cell groups (e.g., neighboring word lines). The memory device then selects the reading configuration based on the programming status of the neighboring cell groups. In alternative embodiments, the memory device reads the programming status directly from the neighboring cell groups, irrespective of reports from the controller.

The programming status of a neighboring cell group is important in the readout process because it is often indicative of the level of interference that is potentially caused by this neighboring cell group. The memory device can match the reading configuration to this expected interference, for example by selecting appropriate read thresholds and/or selectively activating an interference cancellation process. As a result, reading performance is improved. Moreover, the computational complexity and latency associated with interference cancellation can be reduced, because interference cancellation is invoked only when strong interference is likely to be present.

In some embodiments, the memory system stores multiple sets of candidate read thresholds for reading the analog memory cells. Each candidate set of read thresholds is best suited for readout under certain circumstances (e.g., start-of-life of the memory cells, end-of-life of the memory cells, low temperature, high temperature, strong interference or weak interference). When intending to read a group of memory cells, the system evaluates a predefined criterion with respect to this cell group, and then defines an order among the candidate sets of read thresholds based on the criterion. Typically, the criterion is defined so that candidate sets that are most likely to enable successful readout appear early in the order. The system attempts to read the memory cells by iterating over the candidate sets according to the above-defined order. Since the order is defined so as to match the current circumstances of the cell group in question, readout is likely to succeed after a small number of attempts. As a result, the average number of read operations and the average reading time are reduced.

System Description

FIG. 1 is a block diagram that schematically illustrates a memory system 20, in accordance with an embodiment of the present invention. System 20 can be used in various host systems and devices, such as in computing devices, cellular phones or other communication terminals, removable memory modules ("disk-on-key" devices), Solid State Disks (SSD), digital cameras, music and other media players and/or any other system or device in which data is stored and retrieved.

System 20 comprises a memory device 24, which stores data in a memory cell array 28. The memory array comprises multiple analog memory cells 32. In the context of the present patent application and in the claims, the term "analog memory cell" is used to describe any memory cell that holds a continuous, analog value of a physical parameter, such as an electrical voltage or charge. Array may comprise solid-state analog memory cells of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM) and/or Dynamic RAM (DRAM) cells.

The charge levels stored in the cells and/or the analog voltages or currents written into and read out of the cells are referred to herein collectively as analog values, storage values or analog storage values. Although the embodiments described herein mainly address threshold voltages, the methods and systems described herein may be used with any other suitable kind of storage values.

System 20 stores data in the analog memory cells by programming the cells to assume respective memory states, which are also referred to as programming levels. The programming levels are selected from a finite set of possible levels, and each level corresponds to a certain nominal storage value. For example, a 2 bit/cell MLC can be programmed to assume one of four possible programming levels by writing one of four possible nominal storage values into the cell.

Memory device 24 comprises a reading/writing (R/W) unit 36, which converts data for storage in the memory device to analog storage values and writes them into memory cells 32. In alternative embodiments, the R/W unit does not perform the conversion, but is provided with voltage samples, i.e., with the storage values for storage in the cells. When reading data out of array 28, R/W unit 36 converts the storage values of memory cells 32 into digital samples having a resolution of one or more bits. Data is typically written to and read from the memory cells in groups that are referred to as pages. In some embodiments, the R/W unit can erase a group of cells 32 by applying one or more negative erasure pulses to the cells.

The storage and retrieval of data in and out of memory device 24 is performed by a Memory Signal Processor (MSP) 40. MSP 40 comprises an interface 44 for communicating with memory device 24, and a signal processing unit 48, which processes the data that is written into and read from device 24. In some embodiments, unit 48 produces the storage values for storing in the memory cells and provides these values to R/W unit 36. Alternatively, unit 48 provides the data for storage, and the conversion to storage values is carried out by the R/W unit internally to the memory device. Alternatively to using an MSP, the methods described herein can be carried out by any suitable type of memory controller. In some embodiments, unit 48 encodes the data for storage with an Error Correction Code (ECC), and decodes the ECC of data that is read from memory.

MSP 40 communicates with a host 52, for accepting data for storage in the memory device and for outputting data retrieved from the memory device. MSP 40, and in particular unit 48, may be implemented in hardware. Alternatively, MSP 40 may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. For example, although the example of FIG. 1 shows a single memory device, in alternative embodiments MSP 40 may control multiple memory devices 24. Elements that are not necessary for understanding the principles of the present invention, such as various interfaces, addressing circuits, timing and sequencing circuits and debugging circuits, have been omitted from the figure for clarity.

In the exemplary system configuration shown in FIG. 1, memory device 24 and MSP 40 are implemented as two separate Integrated Circuits (ICs). In alternative embodiments, however, the memory device and the MSP may be integrated on separate semiconductor dies in a single Multi-Chip Package (MCP) or System on Chip (SoC), and may be interconnected by an internal bus. Further alternatively, some or all of the MSP circuitry may reside on the same die on which the memory array is disposed. Further alternatively, some or all of the functionality of MSP 40 can be implemented in software and carried out by a processor or other element of the host system. In some embodiments, host 44 and MSP 40 may be fabricated on the same die, or on separate dies in the same device package.

In some embodiments, MSP 40 (or other memory controller that carries out the methods described herein) comprises a general-purpose processor, which is programmed in software to carry out the functions described herein. The software may be downloaded to the processor in electronic form, over a network, for example, or it may, alternatively or additionally, be provided and/or stored on tangible media, such as magnetic, optical, or electronic memory.

In an example configuration of array 28, memory cells 32 are arranged in multiple rows and columns, and each memory cell comprises a floating-gate transistor. The gates of the transistors in each row are connected by word lines, and the sources of the transistors in each column are connected by bit lines. The memory array is typically divided into multiple pages, i.e., groups of memory cells that are programmed and read simultaneously.

Pages are sometimes sub-divided into sectors. In some embodiments, each page occupies an entire row of the array, i.e., an entire word line. For two-bit-per-cell devices, for example, each word line stores two pages. In alternative embodiments, each row (word line) can be divided into two or more pages. For example, in some devices each row is divided into two pages, one comprising the odd-order cells and the other comprising the even-order cells. In an example implementation, a two-bit-per-cell memory device may have four pages per row, a three-bit-per-cell memory device may have six pages per row, and a four-bit-per-cell memory device may have eight pages per row.

Erasing of cells is usually carried out in blocks that contain multiple pages. Typical memory devices may comprise several thousand erasure blocks. In a typical two-bit-per-cell MLC device, each erasure block is on the order of 32 word lines, each comprising several tens of thousands of cells. Each word line of such a device is often partitioned into four pages (odd/even order cells, least/most significant bit of the cells). Three-bit-per cell devices having 32 word lines per erasure block would have 192 pages per erasure block, and four-bit-per-cell devices would have 256 pages per block. Alternatively, other block sizes and configurations can also be used. Some memory devices comprise two or more separate memory cell arrays, often referred to as planes. Since each plane has a certain "busy" period between successive write operations, data can be written alternately to the different planes in order to increase programming speed.

Figure 2:
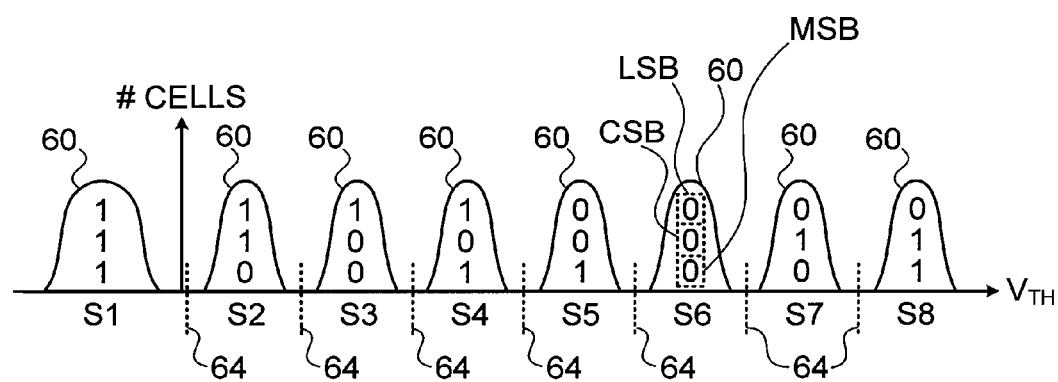
FIG. 2 is a graph showing threshold voltage distribution in a group of analog memory cells, in accordance with an embodiment of the present invention.

FIG. 2 is a graph showing threshold voltage distribution in a group of analog memory cells 32 of memory device 24, in accordance with an embodiment of the present invention. In the present example, the memory cells comprise eight-level MLC, each storing three bits. Each memory cell is programmed to one of eight predefined programming states denoted S1 . . . S8, with each programming state representing a respective combination of three bits. Each programming state corresponds to a certain interval on the threshold voltage ($V_{TH}$) axis.

The memory cells that are programmed to the different memory states have threshold voltages that are statistically distributed in accordance with distributions 60. The three bits stored in a given memory cell are referred to herein as a Least Significant Bit (LSB), a Center Significant Bit (CSB) and a Most Significant Bit (MSB). For example, the memory cells that are programmed with "001" (LSB="0", CSB="0", MSB="1") are associated with programming state S5. The terms LSB, CSB and MSB are used only as a reference to specific MLC bits within the memory cell, and do not imply that certain bits are more important than others. Any other suitable terminology can also be used.

R/W unit 36 typically reads data from a group of memory cells by comparing their threshold voltages to one or more read thresholds, in order to identify the programming state of each read memory cell. The read thresholds are typically positioned in boundary regions between adjacent programming states, in order to differentiate between the threshold voltage intervals of different programming states. In the example of FIG. 2, the R/W unit can read the three bits from a group of memory cells by comparing their threshold voltages to seven read thresholds 64.

In many practical scenarios, the shapes and positions of distributions 60 often vary with time, for example because of electrical charge leakage and other impairments. Distributions 60 may also vary with operating conditions, such as temperature. Therefore, R/W unit 36 sometimes modifies the positions of the read thresholds in order to track the current positions of the threshold voltage distributions and maintain low read error probability. The R/W unit may use any suitable method for adaptively modifying the read threshold positions. Example methods are described in PCT International Publications WO 2007/132457, WO 2008/053472 and WO 2008/111058, whose disclosures are incorporated herein by reference.

In a typical implementation, different MLC bits in a given group of memory cells correspond to different memory pages. For example, a group of eight-level memory cells can be used for storing three memory pages, one page in the cell LSBs, another page in the CSBs, and a third page in the MSBs of the cells. These memory pages are referred to herein as an LSB page, CSB page and MSB page, respectively. Similarly, a group of four-level memory cells can be used for storing two memory pages, one page in the cell LSBs and another page in the cell MSBs. generally, a group of N bits/cell memory cells is typically capable of storing N memory pages. Within a given group of memory cells, programming typically progresses from LSB to MSB.

In some cases, however, a given group of N bits/cell memory cells (e.g., a word line) can be programmed with less than N pages, either temporarily or permanently. Such a group of memory cells is referred to herein as partially programmed. A group of N bits/cell memory cells in which all N pages are programmed is referred to herein as fully programmed. For example, a group of 3 bits/cell memory cell can be partially programmed with only the LSB page or with only the LSB and CSB pages.

When a group of memory cells is programmed with only the LSB page, the threshold voltages of these memory cells populate only two programming states. When a group of memory cells is programmed with only the LSB and CSB pages, the threshold voltages of the memory cells populate four programming states. The positions of the programming states in a partially-programmed group of memory cells are not necessarily a subset of the full set of programming states. The shape (e.g., variance) of the threshold voltage distributions may also differ depending on whether the group of cells is fully programmed or partially programmed. Typically, the threshold voltages (e.g., the average or maximum threshold voltage) in a partially-programmed group of memory cells are considerably lower than those of a fully-programmed group of memory cells.

Typically, R/W unit 36 programs and reads memory pages from groups of memory cells using a predefined set of read and write commands. Typically, a different read command is defined for reading each page type (e.g., an LSB read command, a CSB read command and an MSB read command), since the R/W unit performs different operation sequences when reading different types of pages. Similarly, a different write command is defined for programming each page type (e.g., an LSB write command, a CSB write command and an MSB write command).

Typically, each type of read command uses a certain subset of the read thresholds for reading the appropriate page type. In the configuration of FIG. 2, for example, the LSB read command uses a single read threshold positioned between programming states S4 and S5. The CSB read command uses two read thresholds, which are positioned between programming states S2 and S3 and between programming states S6 and S7. The MSB read command uses four read thresholds, which are positioned between programming states S1 and S2, between programming states S3 and S4, between programming states S5 and S6 and between programming states S6 and S7.

Efficient Controller-Assisted Readout

As explained above, the shapes and positions of the threshold voltage distributions that correspond to a given page type may vary depending on whether the memory cells are partially programmed or fully programmed. Therefore, when reading a given page from a given group of cells, R/W unit 36 may select the reading configuration for reading the page depending on the programming status of the group of cells. In particular, the R/W unit may select the reading configuration depending on which pages are programmed in that group. For example, when reading the CSB page from a certain group of cells, the R/W unit may select a certain reading configuration if all three pages (LSB, CSB and MSB) have been programmed, and a different reading configuration if only the LSB and CSB have been programmed.

The R/W unit may vary the reading configuration by varying any suitable attribute of the read commands based on the programming status of the cell group. In some embodiments, the R/W unit may vary the positions of the read thresholds depending on which pages have been programmed. For example, the R/W unit may execute a CSB read command with a certain set of read thresholds when all three pages (LSB, CSB and MSB) are programmed, and a different set of read thresholds when only the LSB and CSB are programmed. As another example, the R/W unit may modify the readout integration time (i.e., the time duration over which the bit line currents or voltages are sensed and integrated) based on the programming status of the cell group. Certain aspects of the integration time used for reading analog memory cells are also addressed in PCT International Publication WO 2008/053473, whose disclosure is incorporated herein by reference.

In some embodiments, the reading configuration is modified by the MSP, either in addition to or instead of modifying the reading configuration by the R/W unit. For example, in many practical cases, a page that belongs to a partially-programmed word line is likely to have fewer errors than a page that belongs to a fully-programmed word line. In some embodiments, the MSP modifies the ECC decoding scheme for decoding the ECC of a given page, based on the programming status of the word line to which the page belongs. For example, the MSP may apply a simpler ECC decoding scheme (e.g., a scheme that is capable of correcting fewer errors and has a shorter decoding time) for decoding a page that belongs to a partially-programmed word line, and a more complex ECC decoding scheme for decoding a page that is part of a fully-programmed word line. Using this technique, the ECC decoding time and the power consumption of the ECC decoder can be reduced. Additionally or alternatively, the R/W unit may select the reading configuration in any other suitable manner, depending on which pages are actually programmed in the memory cell group in question.

In some embodiments, memory device 24 receives an indication of the programming status of the cell group from MSP 40. The MSP typically keeps record of the programming status of the different cell groups (e.g., which pages have already been programmed in each word line), and can therefore provide this information to the memory device.

In these embodiments, the MSP and the memory device support an interface (e.g., a command interface or signal interface) that enables this sort of notification. In some embodiments, the MSP indicates the programming status of the cell group as part of the read command it sends to the memory device. For example, a command interface between the MSP and the memory device may support a read command that specifies (1) the word line to be read, (2) the page type (e.g., LSB, CSB or MSB page) to be read from this word line, and (3) the programming status of this word line (e.g., which of the LSB, CSB and MSB pages are programmed). Alternatively, the MSP may indicate the programming status of the cell group to the memory device in a separate command, or using any other suitable mechanism.

In some memory devices, the programming status of each word line is stored in one or more status flags in the memory cells of the word line. It is possible in principle for the R/W unit to read these status flags and set the reading configuration accordingly. This scheme, however, involves reading additional memory cells before setting the reading configuration, and therefore increases the overall sense time. By using the disclosed method that reports the programming status from the MSP, the memory device can avoid reading this information from the memory device, and thus reduce the overall sense time. In an example Flash memory device, the reduction in sense time is on the order of 25 μS.

FIG. 3 is a flow chart that schematically illustrates a method for reading data from analog memory cells 32, in accordance with an embodiment of the present invention. The method begins with MSP 40 receiving from host 52 a request to retrieve certain data, at a host requesting step 70. The requested data is assumed to be stored in one or more memory pages in memory device 24.

The MSP sends to memory device 24 (using unit 48 via interface 44) a read command for retrieving one of the requested pages, at a read requesting step 74. The MSP also notifies the memory device of the programming status of the word line of the requested page. In particular, the programming status indicates which pages in this word line are programmed. The programming status notification may be part of the read command or it may be provided to the memory device separately.

R/W unit 36 in memory device 24 selects and sets the reading configuration for reading the requested page based on the reported programming status, at a reading setup step 78. For example, the R/W unit may select and set the read thresholds for reading the requested page based on the programming status indicated by the MSP. The R/W unit then reads the requested page using the selected reading configuration, at a reading step 82. The read page is provided to the MSP. When the data requested by the host spans multiple pages, the process of steps 74-82 is typically repeated for each page. The MSP sends the read data to the host.

Consider, for example, a 2 bits/cell memory device, which stores two pages in each word line. In some embodiments, this memory device can be optimized to have minimal read latency in reading the fully-programmed word lines, or in reading the partially-programmed word lines. When the memory device is optimized for short reading latency in reading the fully-programmed word lines, the latency in reading the partially-programmed word lines will typically be increased, and vice versa. In many practical implementations, most of the word lines are fully programmed and only few word lines are partially programmed, so that optimization for short reading latency in reading the fully-programmed word lines may be preferred.

In some cases, however, there is a benefit in optimizing the device for minimal reading latency in reading partially-programmed word lines. For example, management data is sometimes stored in MLC devices using only the LSB pages (while refraining from programming the respective MSB pages of these word lines) so as to achieve higher storage reliability. When using this technique, a large number of word lines may be partially programmed, so that optimization for short reading latency in reading the partially-programmed word lines may be preferred. The method of FIG. 3 can be used with either kind of optimization. Similar considerations and optimizations can be applied in other kinds of MLC devices, such as when storing 2 bits/cell in a 3 bits/cell device.

In some embodiments, R/W unit 36 selects the reading configuration for reading a given page based on the programming status of one or more neighboring cell groups, e.g., neighboring word lines. (This scheme can be applied additionally or alternatively to setting the reading configuration based on the programming status of the cell group from which the requested page is read.) The programming status of a neighboring cell group affects the readout process from the given cell group because it is indicative of the level of interference that is potentially caused by this neighboring cell group.

Typically, the memory cells in a partially-programmed neighboring word line are expected to cause less interference to the given cell group in comparison with a fully-programmed neighboring word line, for several reasons. For example, the memory cells in a partially-programmed neighboring word line usually have relatively low threshold voltages, and are therefore expected to cause less interference. Moreover, some memory devices program each word line using an iterative Programming and Verification (P&V) process, and employ a page programming order that is optimized for interference. In such devices, when a word line is partially programmed, its interference to the previous word line is usually already cancelled by the P&V programming process of the previous word line.

In some embodiments, when intending to read a given page from a given cell group, the MSP notifies the memory device of the programming status of one or more neighboring cell groups (e.g., neighboring word lines). The memory device (and in particular R/W unit 36) selects the reading configuration for reading the given page based on the reported status of the neighboring cell groups. The MSP may send the programming status of the neighboring cell groups to the memory device as part of the read command, or separately. As explained above, the MSP and the memory device may support a command or signal interface for this purpose.

R/W unit 36 in memory device 24 may select and set the reading configuration based on the reported programming status of neighboring cell groups in any suitable manner. In some embodiments, the R/W unit may select the read thresholds for reading the given page based on the programming status of neighboring cell groups. For example, the R/W unit may select a set of read thresholds that is best suited for strong interference scenarios when the reported programming status indicates that neighboring cell groups are fully programmed. When the programming status indicates that neighboring cell groups are not programmed or only partially programmed, the R/W unit may select another set of read thresholds that is suitable for low interference scenarios.

As another example, the R/W unit may decide whether or not to apply an interference cancellation process to the read memory page, based on the programming status of neighboring cell groups. Applying interference cancellation typically involves reading one or more neighboring memory cell groups in order to assess the interference they cause. Having access to the programming status of neighboring cell groups enables the R/W unit to read a certain neighboring cell group selectively, e.g., only when the programming status indicates that this cell group is likely to cause strong interference.

For example, the R/W unit may read a certain neighboring cell group only, and apply interference cancellation using this neighboring cell group, only if the neighboring cell group is fully programmed or programmed with at least a certain number of pages. For example, in a 3 bits/cell device, the R/W unit may read and perform interference cancellation using a certain neighboring word line only if at least the LSB and CSB pages in that word line are programmed. If only the LSB is programmed, reading and interference cancellation may be skipped. Thus, by having the programming status of neighboring cell groups reported to the memory device, the R/W unit and/or the MSP may activate interference cancellation only when necessary. Therefore, the average number of read operations and/or the average number of computations is reduced.

As noted above, some memory devices store the programming status of each word line in one or more status flags in the memory cells of the word line. It is possible in principle for the R/W unit to read the status flags of the neighboring word lines and set the reading configuration from the given word line accordingly. This scheme, however, involves performing additional reading operations from the neighboring word lines, and therefore increases the overall reading time. By reporting the programming status of neighboring word lines from the MSP, the memory device can avoid reading this information from the neighboring lines, and thus reduce the overall sense time.

When carrying out the above-described method, any suitable interference cancellation method can be used. Example methods are described in PCT International Publications WO 2007/132453 and WO 2008/026203 and U.S. Patent Application Publication 2009/0158126, whose disclosures are incorporated herein by reference, and in PCT International Publication WO 2007/132457, cited above.

Additionally or alternatively, memory device 24 may select any other suitable property of the reading configuration based on the programming status of neighboring cell groups, using any other suitable criteria. In some embodiments, the criteria may attempt to minimize the average readout time, the maximum readout time, or both.

FIG. 4 is a flow chart that schematically illustrates a method for reading data from analog memory cells 32, in accordance with an embodiment of the present invention. The method begins with MSP 40 receiving from host 52 a request to retrieve certain data, at a data requesting step 90. The requested data is assumed to be stored in one or more memory pages in memory device 24. The MSP sends to memory device 24 (using unit 48 via interface 44) a read command for retrieving one of the requested pages, at a read command sending step 94. The MSP notifies the memory device of the programming status of one or more word lines that neighbor the word line of the requested page, at a neighbor status reporting step 98. The programming status typically indicates which pages in the neighboring word lines are programmed. As noted above, the programming status notification may be part of the read command or it may be provided to the memory device separately.

R/W unit 36 in memory device 24 selects and sets the reading configuration for reading the requested page based on the reported programming status of the neighboring word lines, at a reading selection step 102. The R/W unit then reads the requested page using the selected reading configuration, at a reading step 106. The read page is provided to the MSP. When the data requested by the host spans multiple pages, the process of steps 94-106 is typically repeated for each page. The MSP sends the retrieved data to the host.

In alternative embodiments, R/W unit 36 in memory device 24 obtains the programming status of the neighboring word lines by reading the status flags of these word lines, independently of the MSP. The R/W unit then selects the reading configuration based on the read programming status of the neighboring word lines.

FIG. 5 is a flow chart that schematically illustrates a method for reading data from analog memory cells 32, in accordance with an embodiment of the present invention. The method begins with R/W unit 36 receiving a read command from MSP 40, at a read requesting step 110. The read command addresses a given page that is stored in a given word line. The R/W unit reads the status flags of one or more neighboring word lines, at a neighbor status reading step 114. Based on the read status flags, R/W unit 36 determines which pages in each neighboring word lines are programmed. Based on this information, the R/W unit selects the appropriate reading configuration, at a configuration selection step 118. The R/W unit then reads the given page from the given word line using the selected reading configuration, at a readout step 122. The read page is provided from the memory device to the MSP. When carrying out the method of FIG. 5, any of the selection criteria and reading configurations described with respect to FIG. 4 above can be used.

Adaptive Ordering of Read Threshold Sets

As explained above, the threshold voltage distributions in memory cells 32 may vary with time and/or operating conditions. The threshold voltage distributions may also differ among different cell groups in the memory device, such as between odd- and even-order cells in a word line, or between a word line at the edge of an erasure block and a word line at the interior of the block. Variations in the threshold voltage distributions may also occur as a result of interference or for any other reason. Because of these variations, in many cases a single set of read thresholds does not provide adequate reading performance under all circumstances.

In some embodiments, system 20 holds two or more candidate sets of read thresholds. Typically, each candidate set of read thresholds performs well under certain circumstances and may perform poorly under other circumstances. For example, system 20 may hold multiple candidate sets of read thresholds that match different stages in the life cycle of the memory device (e.g., a start-of-life set, a mid-life set and an end-of-life set). Additionally or alternatively, the system may hold candidate sets of read thresholds that are suitable for different temperatures, different levels of interference from neighboring cells, different locations in the memory array, and/or any other conditions. Some candidate sets may represent combinations of conditions, e.g., a candidate set that is best suited for end-of-life at high temperature.

In many cases, however, the number of candidate sets is large, and trying them sequentially in order to find the best-performing set for a given read operation increases the reading time considerably. Therefore, in some embodiments system 20 evaluates a criterion with respect to the memory cells in question, and then orders the candidate sets according to this criterion. The order is defined so that candidate sets that are more likely to provide good reading performance appear first. Ideally, the candidate sets are ordered in descending order of their likelihood to read the memory cells successfully.

When attempting to read the memory cells, system 20 iterates over the candidate sets, i.e., tries the candidate sets one by one, according to the above-described order. Since the candidate sets that are most likely to succeed are attempted first, the average number of attempts is considerably reduced because of the adaptive ordering. As a result, the average reading time is reduced.

System 20 may use various criteria for ordering the candidate sets of read thresholds when intending to read a given group of memory cells. The order may depend, for example, on the current wear level of the cell group in question (e.g., the number of programming and erasure cycles the cell group has gone through). In this example, if the cell group to be read is relatively aged, end-of-life candidate sets will appear early in the order, and vice versa. As another example, the order may depend on the current temperature of the memory device. In this example, if the memory device currently operates at high temperature, candidate sets suitable for high temperature will appear first in the order, and vice versa.

As yet another example, the order may depend on the location of the cell group in array 28. For example, if the cell group is located in the first or last word line of an erasure block, candidate set that are suitable for such locations will appear first. The order may alternatively depend on the level of interference inflicted on the cell group. If the cell group in question suffers from severe interference, candidate sets suitable for high interference will appear first, and vice versa. The level of interference can be assessed using various means. For example, the memory device may read the status flags of neighboring word lines in order to determine which pages in those word lines are already programmed. The programming status of neighboring word lines, as explained above, can be used as an indication of the interference level in the cell group. Alternatively, the programming status of neighboring word lies can be reported to the memory device by the MSP. Additionally or alternatively, the ordering of the candidate sets of read thresholds may depend on any other suitable criterion defined with respect to the cell group to be read.

Figure 6:
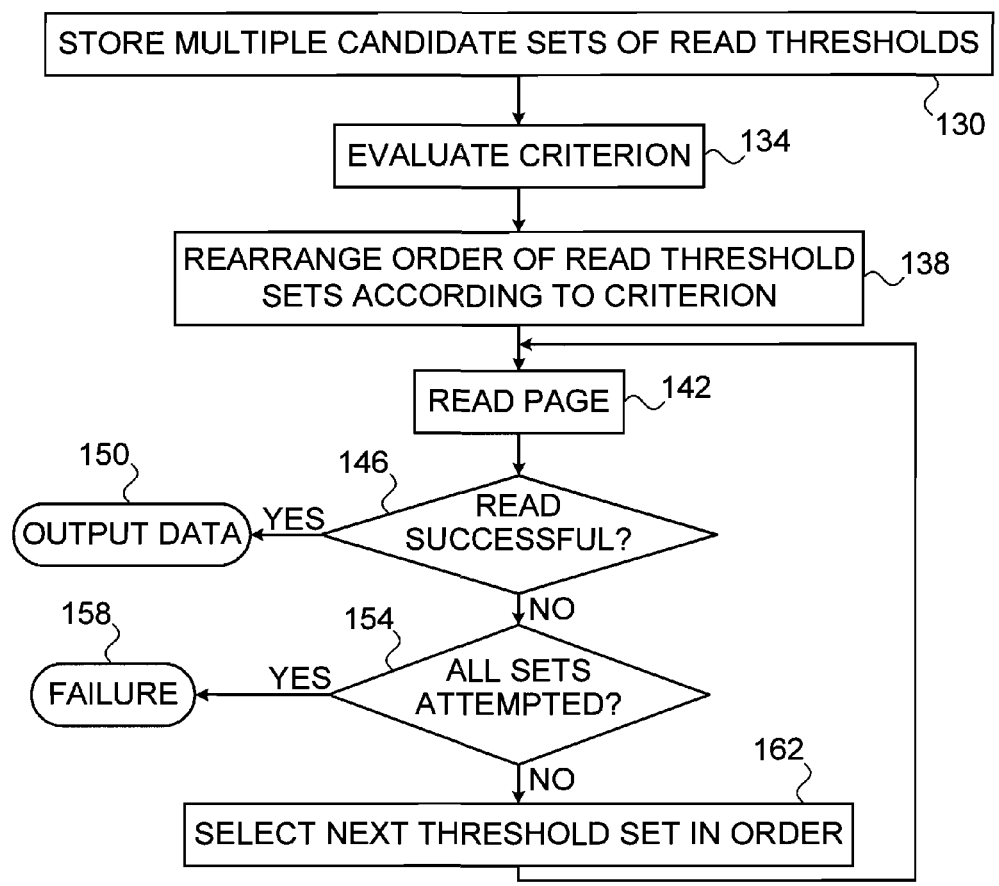

FIG. 6 is a flow chart that schematically illustrates a method for reading data from analog memory cells 32, in accordance with an embodiment of the present invention. The method begins with system 20 storing multiple candidate sets of read thresholds, at a candidate storage step 130. When intending to read certain data, system 20 identifies a given group of memory cells from which the data is to be read. The system then evaluates a criterion that is defined with respect to the memory cells in this group, at a criterion evaluation step 134. The system may evaluate any of the criteria described above, or any other suitable criterion. System 20 arranges the candidate sets of read thresholds in a certain order, based on the evaluated criterion, at an ordering step 138.

System 20 starts with the first candidate set in the order. R/W unit 36 sets this threshold set and attempts to read the memory cells in the group, at a readout attempting step 142. The system checks whether the readout attempt was successful, at a success checking step 146. In some embodiments, the stored data is encoded with an Error Correction Code (ECC) or Error Detection Code (EDC), and the system decodes the ECC or EDC when reading the data. If the ECC or EDC is decoded without errors, the readout attempt is regarded as successful. If the readout attempt is successful, system 20 outputs the read data, at a success termination step 150, and the method terminates.

If, on the other hand, the readout attempt failed, system 20 checks whether all candidate sets in the order were already attempted, at a set checking step 154. If all candidate sets have been attempted without success, the system reports failure, at a failure termination step 158, and the method terminates. If not all candidate sets have been attempted, system 20 selects and sets the next candidate set according to the order, at a set incrementing step 162. The method then loops back to step 142 above, in which the system attempts to read the data using the next candidate set of read thresholds.

The method of FIG. 6 can be carried out by MSP 40, by R/W unit 36, or jointly by the MSP and the R/W unit. For example, the MSP may define the order of candidate sets, and send the desired order to the memory device as part of the read command. In this example, the memory device may attempt readout according to the order sent by the MSP, and return the read results once the readout is successful. (The memory device may use any suitable internal indications for successful readout, such as the number of "1" and/or "0" values in the read page.) In alternative embodiments, any other suitable partitioning of functions between the MSP and the memory device can be defined.

In some embodiments, MSP 40 and/or R/W unit 36 may record the set of read thresholds for which readout was successful, for future use. The MSP and/or R/W unit may attempt this read threshold set first when performing subsequent read operations from the cell group in question. Since this read threshold set was provided successful readout in a certain read operation from the cell group, it is likely to be successful in the next readout operation from this cell group. In alternative embodiments, the MSP and/or R/W unit may consider this read threshold set in any other way when defining the order for performing subsequent read operations from the cell group, e.g., by placing it in one of the first places in the order, but not necessarily in the first place.

Typically, the MSP and/or the memory device holds a data structure that holds the values of the previously-successful read thresholds for each cell group (e.g., for each erasure block). When preparing to perform readout from a given cell group, the MSP and/or R/W unit retrieves the previously-successful read threshold values from the data structure, and uses them when defining the order of candidate read threshold sets.

Although the embodiments described herein mainly address solid state memory devices, the methods and systems described herein can also be used in other types of storage devices, such as Hard Disk Drives (HDD). Although the embodiments described herein refer mainly to MLC devices, the methods and systems described herein can be used with SLC devices, as well.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method, comprising:
sending, from a controller, to a memory device, which includes a plurality of analog memory cells, a request to read a requested memory page that is stored in a first group of the plurality of analog memory cells;
selecting a reading configuration;
receiving, from the controller, by the memory device, a programming status of a second group of the memory cells;
modifying the reading configuration dependent upon the received programming status of the second group of memory cells of the plurality of analog memory cells;
reading the requested memory page from the group of the plurality of memory cells using the modified reading configuration; and
receiving, by the controller, the requested memory page from the memory device.

2. The method according to claim 1, wherein the second group of the memory cells is capable of storing one or more memory pages, and wherein receiving the programming status comprises indicating to the memory device which of the one or more memory pages have been programmed in the second group.

3. The method according to claim 1, wherein the reading configuration comprises a readout integration time.

4. The method according to claim 1, wherein the memory cells in the first group and the memory cells in the second group are interleaved with one another in a given row of the memory device.

5. The method according to claim 1, wherein the memory cells in the first group are located in a first row of the memory device, and wherein the memory cells in the second group are located in a second row of the memory device, different from the first row.

6. The method according to claim 1, wherein sending the request and reporting the programming status comprise sending from the controller to the memory device a single command, which comprises the request and the programming status.

7. A method, comprising:
receiving, from a controller, by a memory device which includes a plurality of memory cells, a request to read a memory page that is stored in a first group of the plurality of memory cells and an indication of a programming status of a second group of the plurality of memory cells;
selecting a reading configuration responsively to the received indication;
reading the requested memory page from the first group of the memory cells using the selected reading configuration; and
outputting the requested memory page to the controller.

8. The method according to claim 7, wherein the second group of the memory cells is capable of storing one or more memory pages, and wherein the indication of a programming status is indicative of which of the one or more memory cells have been programmed in the second group.

9. The method according to claim 7, wherein the first group of the plurality memory cells is equal to the second group of the plurality of memory cells.

10. The method according to claim 7, wherein the memory cells in the first group and the memory cells in the second group are interleaved with one another in a given row of the memory device.

11. The method according to claim 7, wherein the memory cells in the first group are located in a first row of the memory device, and wherein the memory cells in the second group are located in a second row of the memory device, different from the first row.

12. The method according to claim 7, wherein receiving the request and the indication comprises receiving in the memory device a single command, which is sent from the controller and comprises the request and the indication.

13. The method according to claim 7, wherein selecting the reading configuration comprises modifying one or more read thresholds that are used in reading the requested memory page.

14. The method according to claim 7, wherein the first group is distinct from the second group, and wherein selecting the reading configuration comprises selectively activating, based on the received indication, an interference cancellation process that cancels interference caused by the second group to the first group.

15. The method according to claim 7, wherein selecting the reading configuration comprises modifying a readout integration time.

16. The method according to claim 7, wherein the requested memory page is encoded with an Error Correction Code (ECC), and wherein selecting the reading configuration comprises modifying an ECC decoding scheme used in decoding the ECC of the requested memory page.

17. A data storage apparatus, comprising:
a memory device;
a processing device; and
an interface configured to communicate with the memory device and the processing device;
wherein the memory device comprises:
a plurality of analog memory cells; and
circuitry coupled to the plurality of analog memory cells, wherein the circuitry is configured to:
receive a request, from the processing device, to read a memory page that is stored in a first group of memory cells of the plurality of analog memory cells;
select a reading configuration;
receive a programming status, from the processing device, of a second group of memory cells of the plurality of memory cells;
modify the reading configuration dependent upon the programming status;
convert, dependent upon the reading configuration, storage values of the first group of memory cells into digital samples; and
output the digital samples to the processing device.

18. The apparatus according to claim 17, wherein the second group of the memory cells is capable of storing one or more memory pages, and wherein the programming status indicates to the memory device which of the one or more memory pages have been programmed in the second group.

19. The apparatus according to claim 17, wherein the first group of memory cells is equal to the second group of memory cells.

20. The apparatus according to claim 17, wherein the memory cells in the first group and the memory cells in the second group are interleaved with one another in a given row of the memory device.

21. The apparatus according to claim 17, wherein the memory cells in the first group are located in a first row of the memory device, and wherein the memory cells in the second group are located in a second row of the memory device, different from the first row.

22. The apparatus according to claim 17, wherein the processing device is configured to send to the memory device a single command, which comprises the request and the programming status.

23. A memory device, comprising:
 a plurality of analog memory cells; and
 circuitry, which is configured to receive from a controller a request to read a requested memory page that is stored in a first group of the memory cells, and an indication of a programming status of a second group of the memory cells, to select a reading configuration responsively to the indicated programming status, to read the requested memory page from the first group of the memory cells using the selected reading configuration, and to output the requested memory page to the controller.

24. The memory device according to claim 23, wherein the second group of the memory cells is capable of storing one or more memory pages, and wherein the indication is indicative of which of the one or more memory pages have been programmed in the second group.

25. The memory device according to claim 23, wherein the first group of memory cells is equal to the second group of memory cells.

26. The memory device according to claim 23, wherein the memory cells in the first group and the memory cells in the second group are interleaved with one another in a given row of the memory device.

27. The memory device according to claim 23, wherein the memory cells in the first group are located in a first row of the memory device, and wherein the memory cells in the second group are located in a second row of the memory device, different from the first row.

28. The memory device according to claim 23, wherein the circuitry is further configured to receive from the controller a single command, which comprises the request and the indication.

29. The memory device according to claim 23, wherein the circuitry is further configured to select the reading configuration by modifying one or more read thresholds that are used in reading the requested memory page.

30. The memory device according to claim 23, wherein the first group of memory cells is distinct from the second group of memory cells, and wherein the circuitry is further configured to select the reading configuration by selectively activating, based on the indication, an interference cancellation process that cancels interference caused by the second group of memory cells to the first group of memory cells.

31. The memory device according to claim 23, wherein to select the reading configuration comprises modifying a read-out integration time.

32. The memory device according to claim 23, wherein the requested memory page is encoded with an Error Correction Code (ECC), and wherein the circuitry is configured to select the reading configuration by modifying an ECC decoding scheme used in decoding the ECC of the requested memory page.

* * * * *